US011239368B2

(12) United States Patent
Holland et al.

(10) Patent No.: US 11,239,368 B2
(45) Date of Patent: Feb. 1, 2022

(54) SEMICONDUCTOR DEVICE AND METHOD

(71) Applicant: Taiwan Semiconductor Manufacturing Company, Ltd., Hsinchu (TW)

(72) Inventors: Martin Christopher Holland, Bertem (BE); Blandine Duriez, Brussels (BE); Marcus Johannes Henricus van Dal, Linden (BE); Yasutoshi Okuno, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 18 days.

(21) Appl. No.: 16/805,958

(22) Filed: Mar. 2, 2020

(65) Prior Publication Data

US 2021/0066499 A1 Mar. 4, 2021

Related U.S. Application Data

(60) Provisional application No. 62/893,947, filed on Aug. 30, 2019.

(51) Int. Cl.
*H01L 29/775* (2006.01)
*H01L 29/36* (2006.01)
(Continued)

(52) U.S. Cl.
CPC .. *H01L 29/7851* (2013.01); *H01L 21/823418* (2013.01); *H01L 21/823431* (2013.01);
(Continued)

(58) Field of Classification Search
None
See application file for complete search history.

(56) References Cited

U.S. PATENT DOCUMENTS 8,962,400 B2 2/2015 Tsai et al.
9,093,514 B2 7/2015 Tsai et al.
(Continued)

FOREIGN PATENT DOCUMENTS

KR 20170041605 A 4/2017
KR 20180112897 A 10/2018
(Continued)

OTHER PUBLICATIONS

Gotoh, R. et al., "Ga segregation during Czochralski-Si crystal growth with Ge codoping," Journal of Crystal Growth 312 (2010), Jul. 13, 2010, pp. 2865-2870.
(Continued)

*Primary Examiner* — Joseph C. Nicely
*Assistant Examiner* — Lamont B Koo
(74) *Attorney, Agent, or Firm* — Slater Matsil, LLP

(57) ABSTRACT

In an embodiment, a device includes: a semiconductor substrate having a channel region; a gate stack over the channel region; and an epitaxial source/drain region adjacent the gate stack, the epitaxial source/drain region including: a main portion in the semiconductor substrate, the main portion including a semiconductor material doped with gallium, a first concentration of gallium in the main portion being less than the solid solubility of gallium in the semiconductor material; and a finishing portion over the main portion, the finishing portion doped with gallium, a second concentration of gallium in the finishing portion being greater than the solid solubility of gallium in the semiconductor material.

20 Claims, 18 Drawing Sheets

(51) Int. Cl.
*H01L 21/768* (2006.01)
*H01L 29/78* (2006.01)
*H01L 29/267* (2006.01)
*H01L 21/8234* (2006.01)
*H01L 29/66* (2006.01)
*H01L 29/417* (2006.01)

(52) U.S. Cl.
CPC ...... *H01L 29/267* (2013.01); *H01L 29/41791* (2013.01); *H01L 29/66795* (2013.01)

(56) References Cited

U.S. PATENT DOCUMENTS

| | | | |
|---|---|---|---|
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,812,363 | B1 | 11/2017 | Liao et al. |
| 9,859,380 | B2 | 1/2018 | Lee et al. |
| 2012/0138897 | A1* | 6/2012 | Lin .................. H01L 29/66628 257/19 |
| 2014/0131720 | A1 | 5/2014 | Hsiung et al. |
| 2017/0104061 | A1 | 4/2017 | Peng et al. |
| 2017/0229578 | A1 | 8/2017 | Pandey et al. |
| 2018/0286861 | A1 | 10/2018 | Choi et al. |
| 2019/0296144 | A1* | 9/2019 | Jung .................. H01L 29/7848 |

FOREIGN PATENT DOCUMENTS

| | | |
|---|---|---|
| TW | I512993 B | 12/2015 |
| TW | 201740440 A | 11/2017 |
| TW | I639184 B | 10/2018 |
| WO | 2015053805 A1 | 4/2015 |
| WO | 2019123303 A1 | 6/2019 |

OTHER PUBLICATIONS

Ijima, F. et al,, "Surface Segregation Behavior of B, Ga, Sb, and As Dopant Atoms on Ge(100) and Ge(111) Examined with a First-principles Method," J. Phys.: Conf. Ser. 417 012008, 2013, 6 pages.

Usui, A., "Atomic Layer Epitaxy of III-V Compounds: Chemistry and Applications," Proceedings of the IEEE, vol. 80, Issue 10, Oct. 1992, pp. 1641-1653.

Wu, Y. et al., "Sub-10-9 O-cm2 Specific Contact Resistivity on P-type Ge and GeSn: In-situ Ga Doping with Ga Ion Implantation at 300 oC, 25 oC, and -100 oC," 2018 IEEE International Electron Devices Meeting (IEDM), 2018, pp. 35.5.1-35.5.4, doi: 10.1109/IEDM.2018.8614619.

* cited by examiner

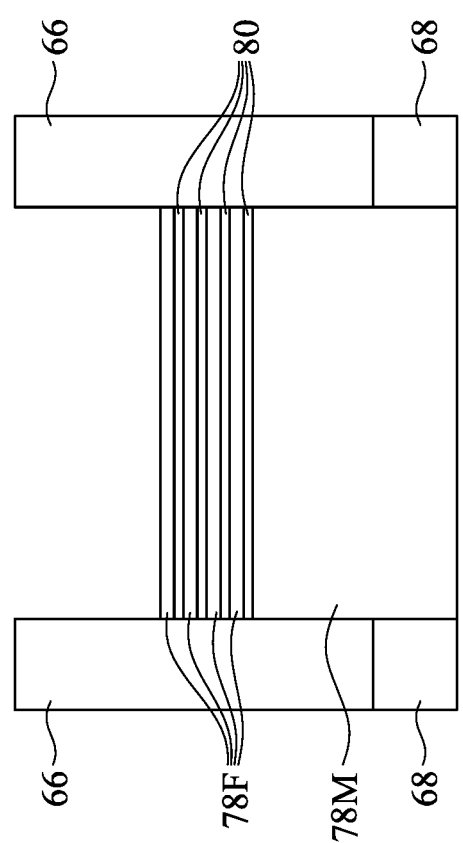

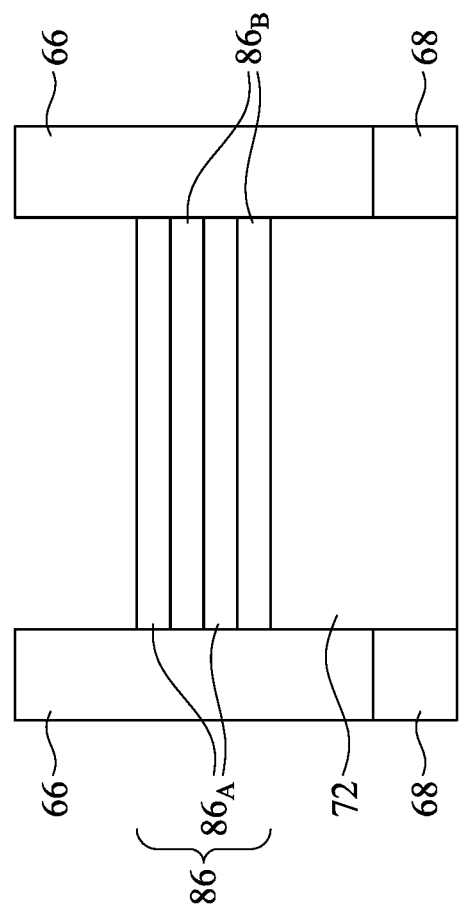

SEMICONDUCTOR DEVICE AND METHOD

PRIORITY CLAIM AND CROSS-REFERENCE

This application claims priority to and the benefit of U.S. Provisional Application No. 62/893,947, filed on Aug. 30, 2019, entitled "Semiconductor Device and Method," which application is hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A through 5F are cross-sectional views of source/drain regions, in accordance with various embodiments.

DETAILED DESCRIPTION

Figure 1:
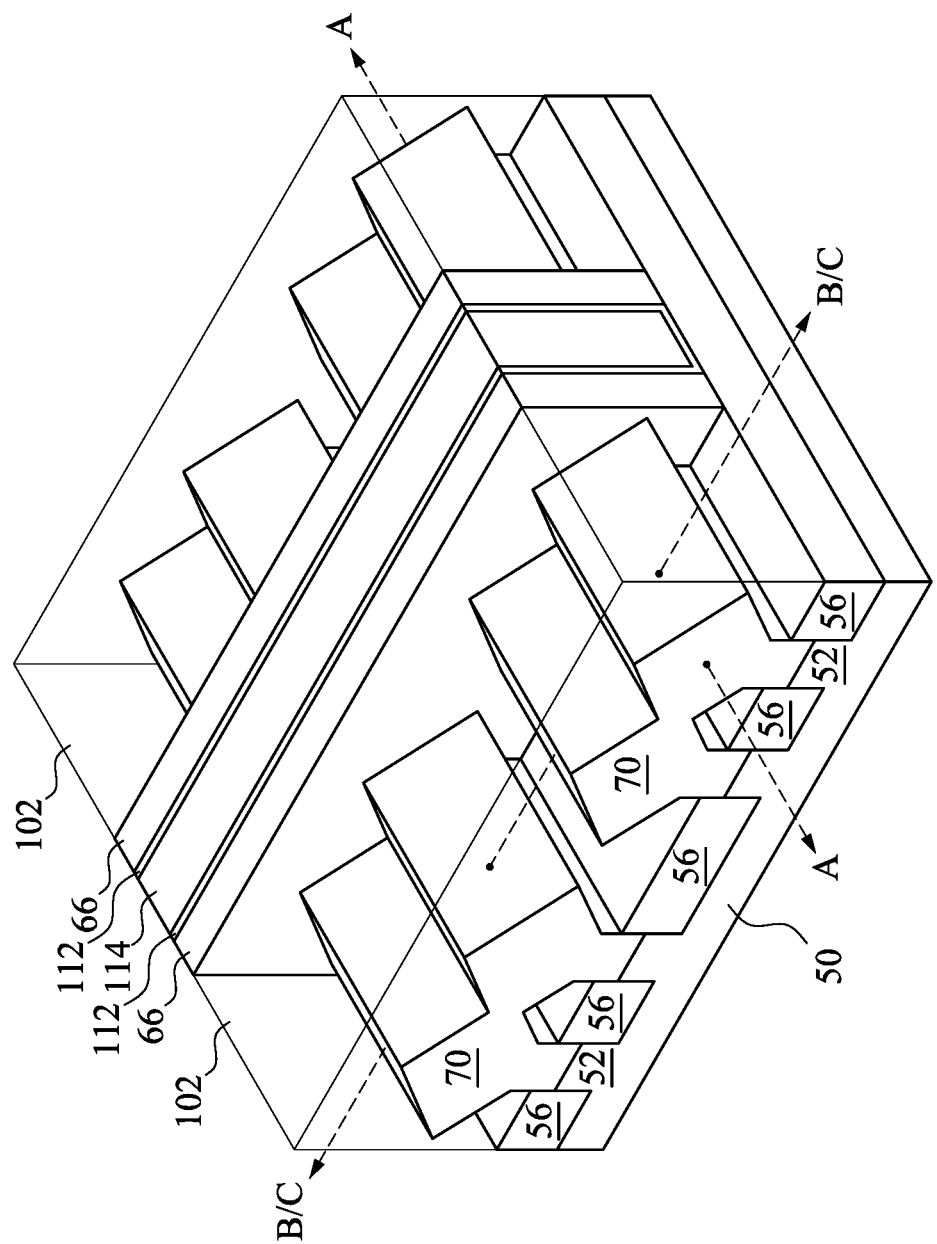
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, epitaxial source/drain regions are grown doped with gallium impurities. The source/drain regions have finishing portions on main portions. The finishing portions are doped with a higher gallium concentration than the main portions, and are formed such that gallium segregation at surfaces of the source/drain regions is avoided. Doping the finishing portions of the source/drain regions with gallium can reduce the contact resistance to the source/drain regions. Avoiding gallium segregation at surfaces of the source/drain regions can help avoid removal of the gallium during subsequent etching processes. Further, doping the finishing portions of the source/drain regions with gallium can increase the quantity of holes in the source/drain regions, which can be particularly advantageous for some types of source/drain regions, such as p-type source/drain regions. Performance of the source/drain regions may thus be improved.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs comprise fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may comprise a single material or a plurality of materials. In this context, the fins 52 refers to the portions extending between the neighboring STI regions 56.

Gate dielectrics 112 are along sidewalls and over top surfaces of the fins 52, and gate electrodes 114 are over the gate dielectrics 112. Source/drain regions 70 are disposed in opposite sides of the fin 52 with respect to the gate dielectrics 112 and gate electrodes 114. Gate spacers 66 separate the source/drain regions 70 from the gate dielectrics 112 and gate electrodes 114. An inter-layer dielectric (ILD) layer 102 is disposed over the source/drain regions 70 and STI regions 56. In embodiments where multiple transistors are formed, the source/drain regions 70 may be shared between various transistors. In embodiments where one transistor is formed from multiple fins 52, neighboring source/drain regions 70 may be electrically connected, such as through coalescing the source/drain regions 70 by epitaxial growth, or through coupling the source/drain regions 70 with a same source/drain contact.

FIG. 1 further illustrates several reference cross-sections. Cross-section A-A is along a longitudinal axis of the fin 52 and in a direction of, for example, a current flow between the source/drain regions 70 of a FinFET. Cross-section B/C-B/C is perpendicular to cross-section A-A and extends through source/drain regions 70 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 2:
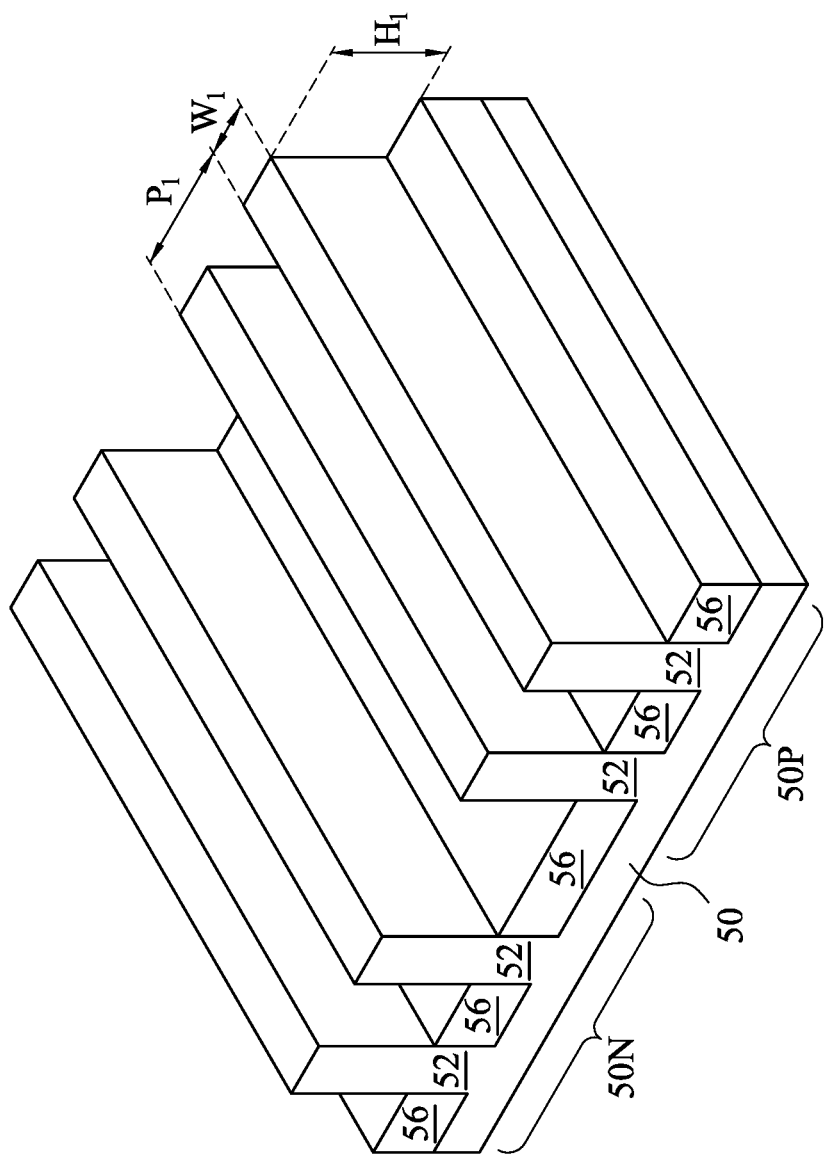
FIGS. 2 and 3 are three-dimensional views of intermediate stages in the manufacturing of FinFETs, in accordance with some embodiments.
Figure 3:
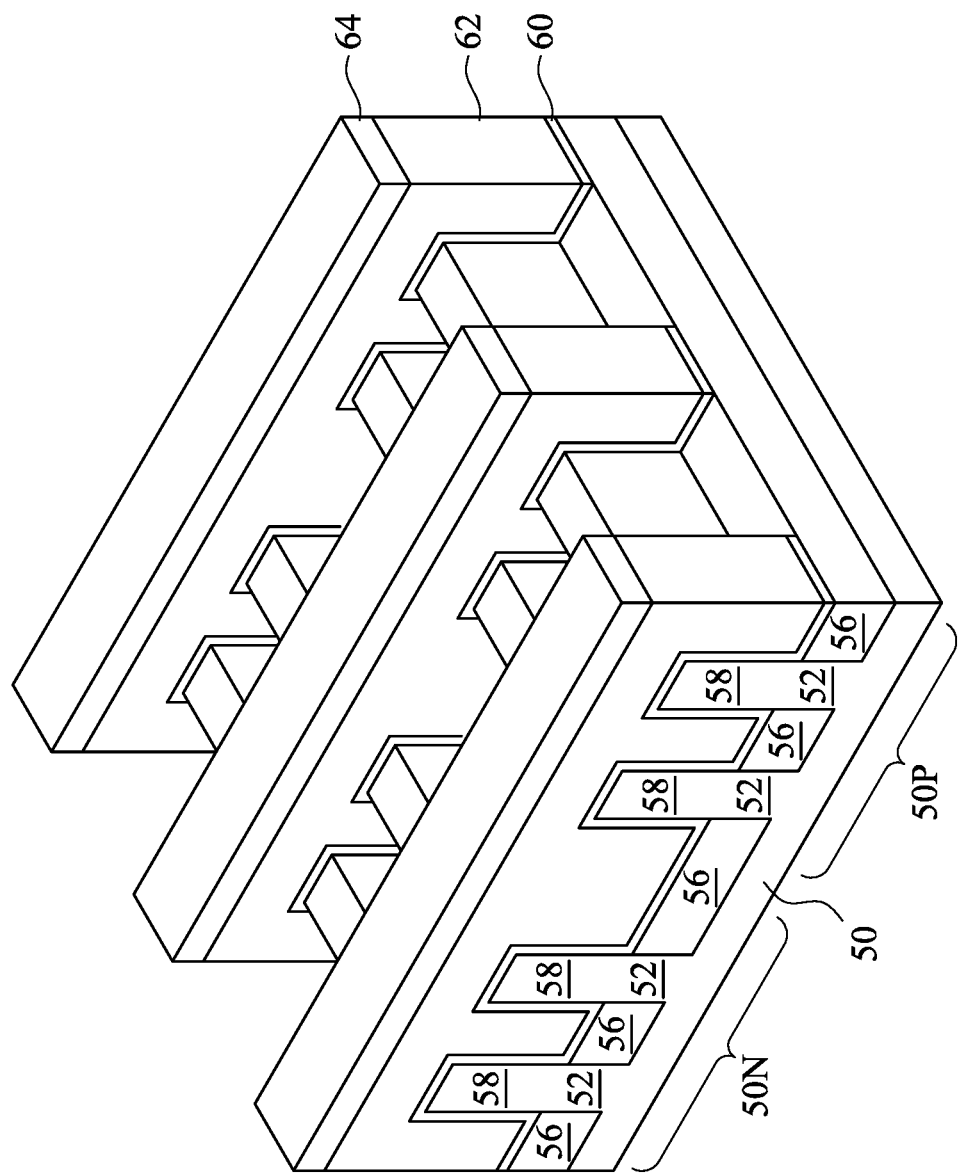

FIGS. 2 through 12B are various views of intermediate stages in the manufacturing of FinFETs, in accordance with some embodiments. FIGS. 2 and 3 are three-dimensional views. FIGS. 4A, 6A, 7A, 8A, 9A, 10A, 11A, and 12A are cross-sectional views illustrated along reference cross-section A-A in FIG. 1, except for multiple fins/FinFETs. FIGS. 4B, 4C, 6B, 7B, 8B, 9B, 10B, 11B, and 12B are cross-sectional views illustrated along reference cross-section B/C-B/C in FIG. 1, except for multiple fins/FinFETs.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. For example, when p-type devices are formed, the substrate 50 may be a strained material such as silicon germanium ($Si_xGe_{1-x}$, where x can be in the range of 0 to 1) having a germanium concentration in the range of about 0% to about 40%, such that FinFETs with p-type fully strained channel (PFSC) regions are formed.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

Fins 52 are formed extending from the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. After formations, the fins 52 have a width $W_1$, and fins 52 in a same region 50N/50P are spaced apart by a pitch $P_1$. The width $W_1$ can be in the range of about 3 nm to about 30 nm. The pitch $P_1$ can be in the range of about 20 nm to about 100 nm.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

STI regions 56 are formed over the substrate 50 and between neighboring fins 52. As an example to form the STI regions 56, an insulation material is formed over the intermediate structure. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Some embodiments may utilize multiple layers. For example, in some embodiments a liner (not shown) may first be formed along a surface of the substrate 50 and the fins 52. Thereafter, a fill material, such as those discussed above may be formed over the liner. A removal process is applied to the insulation material to remove excess insulation material over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material are level after the planarization process is complete. The insulation material is then recessed, with remaining portions of the insulation material forming the STI regions 56. The insulation material is recessed such that upper portions of fins 52 in the region 50N and in the region 50P protrude from between neighboring STI regions 56. After the recessing, exposed portions of the fins 52 extend a height $H_1$ above top surfaces of the STI regions 56. The height $H_1$ can be greater than about 40 nm, such as in the range of about 50 nm to about 80 nm. The exposed portions of the fins 52 include what will be channel regions of the resulting FinFETs.

Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, a chemical oxide removal with a suitable etch process using, for example, dilute hydrofluoric (dHF) acid may be used.

The process described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, after the insulation material of the STI regions 56 is planarized with the fins 52, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

In FIG. 3, dummy gate dielectrics 60 are formed over the fins 52 and dummy gates 62 are formed over the dummy gate dielectrics 60. The dummy gate dielectrics 60 and dummy gates 62 may be collectively referred to as "dummy gate stacks," with each dummy gate stack including a dummy gate dielectric 60 and a dummy gate 62. The dummy gate stacks extend along sidewalls of the fins 52. Although only one dummy gate stack is illustrated, it should be appreciated that multiple dummy gate stacks are simultaneously formed, and each fin 52 may have multiple dummy gate stacks formed thereon.

As an example of forming the dummy gate dielectrics 60 and dummy gates 62, a dummy dielectric layer is formed on the fins 52. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material and may be selected from a group including amorphous silicon, polycrystalline-silicon (polysilicon), poly-crystalline silicon germanium (poly-SiGe), metallic nitrides, metallic silicides, metallic oxides, and metals. The dummy gate layer may be deposited by physical vapor deposition (PVD), CVD, sputter deposition, or other techniques known and used in the art for depositing conductive materials. The dummy gate layer may be made of other materials that have a high etching selectivity from the etching of isolation regions. The mask layer may include, for example, silicon nitride, silicon oxynitride, or the like. In this example, a single dummy gate layer and a single mask layer are formed across the region 50N and the region 50P. It is noted that the dummy dielectric layer is shown covering only the fins 52 for illustrative purposes only. In some embodiments, the dummy dielectric layer may be deposited such that the dummy dielectric layer covers the STI regions 56, extending between the dummy gate layer and the STI regions 56. The mask layer is then patterned using acceptable photolithography and etching techniques to form masks 64. The pattern of the masks 64 is then transferred to the dummy gate layer by an acceptable etching technique to form dummy gates 62. The pattern of the masks 64 is further transferred to the dummy dielectric layer to form dummy gate dielectrics 60. The dummy gates 62 cover respective channel regions 58 of the fins 52. The pattern of the masks 64 may be used to physically separate each of the dummy gates 62 from adjacent dummy gates. The dummy gates 62 may also have a lengthwise direction substantially perpendicular to the lengthwise direction of respective fins 52.

Figure 4B:
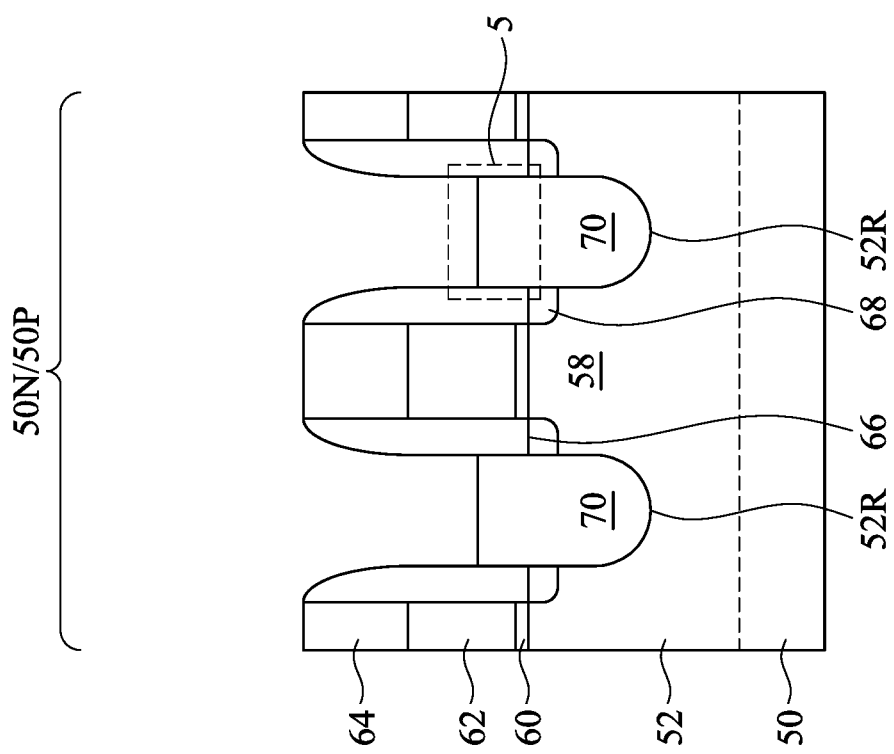
FIGS. 4A through 4C are cross-sectional views of further intermediate stages in the manufacturing of FinFETs, in accordance with some embodiments.
Figure 4A:
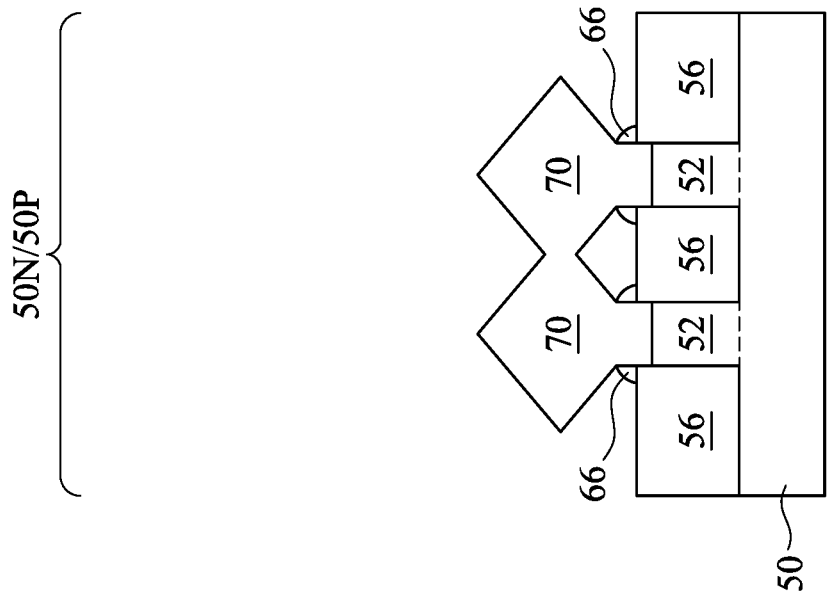

In FIGS. 4A and 4B, gate spacers 66 are formed on exposed surfaces of the dummy gates 62, the masks 64, and/or the fins 52. The gate spacers 66 may be formed by conformally depositing an insulating material and subsequently etching the insulating material. The insulating material of the gate spacers 66 may be silicon nitride, silicon oxide, silicon carbonitride, silicon oxycarbonitride, a combination thereof, or the like. In some embodiments (not shown), the gate spacers 66 are formed from a multi-layered insulating material, and include multiple layers. For example, the gate spacers 66 may include a layer of silicon oxide disposed between two layers of silicon nitride, or may include multiple layers of silicon oxycarbonitride. After etching, the gate spacers 66 can have curved sidewalls (as illustrated in FIG. 4A) or can have straight sidewalls (not illustrated).

Before or during the formation of the gate spacers 66, implants for lightly doped source/drain (LDD) regions 68 may be performed. In the embodiments with different device types, similar to the implants discussed, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The LDD regions 68 may have a concentration of impurities of from about $10^{15}$ cm$^{-3}$ to about $10^{16}$ cm$^{-3}$. An anneal may be used to activate the implanted impurities. The LDD regions 68 adjoin the channel regions 58.

Epitaxial source/drain regions 70 are then formed in the fins 52 to exert stress in the channel regions 58, thereby improving performance. The epitaxial source/drain regions 70 are formed in the fins 52 such that each dummy gate 62 is disposed between respective neighboring pairs of the epitaxial source/drain regions 70. In some embodiments the epitaxial source/drain regions 70 may extend into, and may also penetrate through, the LDD regions 68 and/or fins 52. In some embodiments, the gate spacers 66 are used to separate the epitaxial source/drain regions 70 from the dummy gates 62 by an appropriate lateral distance so that the epitaxial source/drain regions 70 do not short out subsequently formed gates of the resulting FinFETs.

The epitaxial source/drain regions 70 in the region 50N, e.g., the NMOS region, may be formed by masking the region 50P, e.g., the PMOS region, and etching source/drain regions of the fins 52 in the region 50N to form recesses 52R in the fins 52. Then, the epitaxial source/drain regions 70 in the region 50N are epitaxially grown in the recesses 52R. The epitaxial source/drain regions 70 may include any acceptable material, such as appropriate for n-type FinFETs. For example, if the fin 52 is silicon, the epitaxial source/drain regions 70 in the region 50N may include materials exerting a tensile strain in the channel regions 58, such as silicon, silicon carbide, phosphorous doped silicon carbide, silicon phosphide, or the like. The epitaxial source/drain regions 70 in the region 50N may have surfaces raised from respective surfaces of the fins 52 and may have facets.

The epitaxial source/drain regions 70 in the region 50P, e.g., the PMOS region, may be formed by masking the region 50N, e.g., the NMOS region, and etching source/drain regions of the fins 52 in the region 50P to form recesses 52R in the fins 52. Then, the epitaxial source/drain regions 70 in the region 50P are epitaxially grown in the recesses 52R. The epitaxial source/drain regions 70 may include any acceptable material, such as appropriate for p-type FinFETs. For example, if the fin 52 is silicon, the epitaxial source/drain regions 70 in the region 50P may comprise materials exerting a compressive strain in the channel regions 58, such as silicon germanium, germanium, germanium tin, or the like. The epitaxial source/drain regions 70 in the region 50P may also have surfaces raised from respective surfaces of the fins 52 and may have facets.

The epitaxial source/drain regions 70 and/or the fins 52 may be doped with impurities to form source/drain regions, similar to the process previously discussed for forming lightly-doped source/drain regions. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. The epitaxial source/drain regions 70 are in situ doped during growth. Doping during growth instead of by implantation can avoid stress relaxation in the channel regions 58 that occurs during dopant implantation. Performance of the resulting FinFETs may thus be improved.

In some embodiments, the epitaxial source/drain regions 70 are doped with an impurity that will help reduce the contact resistance to the epitaxial source/drain regions 70. In some embodiments, the impurity is gallium. Gallium may, in some examples, have advantageous aspects. For example, gallium has a higher solid solubility in germanium than other impurities, such as boron. Hence, when a germanium content in the epitaxial source/drain regions 70 is high, such as when p-type epitaxial source/drain regions 70 are formed, gallium may have a higher dopant activation, and hence, contribute more holes in comparison to other dopants, which can help reduce the contact resistance when the gallium is concentrated near the contact region of the epitaxial source/drain regions 70.

Gallium has a low bond energy with germanium, and as such, gallium is prone to segregate to the surfaces of epitaxial source/drain regions 70 that comprise germanium. In accordance with some embodiments, the epitaxial source/drain regions 70 are grown in a manner that reduces the amount of gallium segregation and/or mitigates the effects of gallium segregation. After formation, the epitaxial source/drain regions 70 have a large dopant concentration near the surfaces of the epitaxial source/drain regions 70, but the dopant is not completely segregated to the surfaces of the epitaxial source/drain region 70. As discussed further below, a region extending about 2 nm to about 12 nm beneath the top surfaces of the epitaxial source/drain region 70 can be highly doped with gallium. Further, as discussed further below, the epitaxial source/drain regions 70 can be co-doped with multiple impurities, such as both gallium and boron.

Figure 4C:
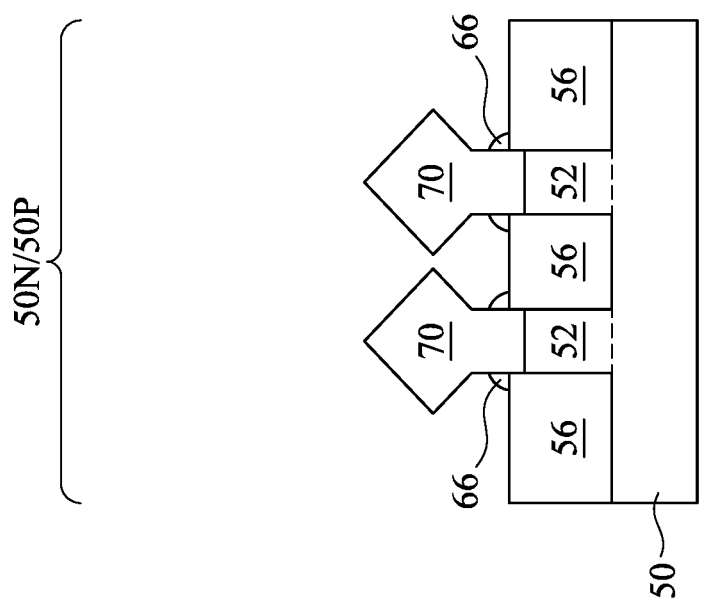

As a result of the epitaxy processes used to form the epitaxial source/drain regions 70 in the region 50N and the region 50P, upper surfaces of the epitaxial source/drain regions 70 have facets which expand laterally outward beyond sidewalls of the fins 52. In some embodiments, these facets cause adjacent epitaxial source/drain regions 70 of a same FinFET to merge as illustrated by FIG. 4B. In other embodiments, adjacent epitaxial source/drain regions 70 remain separated after the epitaxy process is completed as illustrated by FIG. 4C. Dopant segregation can depend on the epitaxy growth direction of the epitaxial source/drain regions 70. Dopant segregation can occur at different rates along different crystalline directions, depending on the dopant and base semiconductor material. For example, when growing gallium doped silicon germanium, gallium has a greater driving force of segregation and a greater activation energy along the <111> direction than along the <100> direction. As such, forming the epitaxial source/drain regions 70 with faceted surfaces as shown in FIGS. 4B and 4C, can help reduce gallium segregation at surfaces of the epitaxial source/drain regions 70. During epitaxy, growth conditions can be selected to favor growth along the <111> direction and promote the formation of epitaxial source/drain regions 70 with faceted upper surfaces. For example, growth along the <111> direction can be promoted by growing at a high temperature, such as a temperature of at least about 550° C., and by growing at a low pressure, such as a pressure in the range of about 10 Torr and about 300 Torr.

In the embodiments illustrated in FIGS. 4B and 4C, gate spacers 66 are formed covering a portion of the sidewalls of the fins 52 that extend above the STI regions 56 thereby blocking the epitaxial growth. In some other embodiments, the spacer etch used to form the gate spacers 66 may be adjusted to remove the spacer material to allow the epitaxially grown region to extend to the surface of the STI region 56.

FIGS. 5A through 5F illustrate epitaxial source/drain regions 70 in accordance with various embodiments. Specifically, a region 5 from FIG. 4A is illustrated in more detail. Each of FIGS. 5A through 5F illustrate an epitaxial source/drain region 70 according to an embodiment, however, it should be appreciated that FinFETs may be formed with features from some, all, or none of the illustrated embodiments. The illustrated epitaxial source/drain regions 70 are formed of the materials appropriate for p-type Fin-FETs, discussed above, and can be formed in the region 50P. Each of the illustrated epitaxial source/drain regions 70 has a main portion and a finishing portion over the main portion, with the finishing portion being highly doped.

Figure 5A:
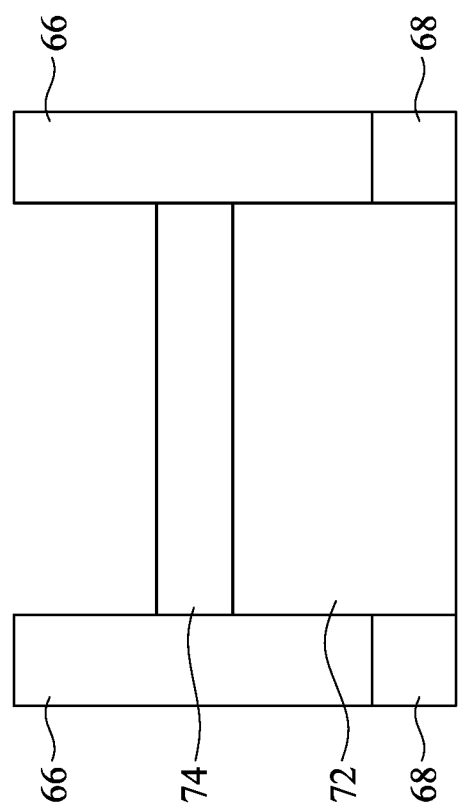

FIG. 5A illustrates an epitaxial source/drain region 70 that includes a main layer 72 and a finishing layer 74. The main layer 72 is in the fins 52, adjoining the LDD regions 68, and the finishing layer 74 is on the main layer 72. The main layer 72 and finishing layer 74 are formed of the same base semiconductor material, e.g., silicon germanium, germanium, germanium tin, etc. However, the main layer 72 and finishing layer 74 are doped to different impurity concentrations. Specifically, the dopant concentration of the finishing layer 74 is greater than that of the main layer 72. For example, when the epitaxial source/drain region 70 is gallium doped silicon germanium, the finishing layer 74 can be doped with more gallium than the main layer 72.

The main layer 72 has a consistent dopant concentration from the upper surface of the main layer 72 to the lower surface of the main layer 72. The dopant concentration in the main layer 72 is low. Specifically, the dopant concentration in the main layer 72 is less than the solid solubility of the dopant in the base semiconductor material of the epitaxial source/drain region 70. The solid solubility of gallium in silicon germanium depends on the temperature and the exact ratio of silicon to germanium, but is usually in the range of about $3 \times 10^{20}$ cm$^{-3}$ to about $5 \times 10^{20}$ cm$^{-3}$, so when the epitaxial source/drain region 70 is gallium doped silicon germanium, the gallium concentration in the main layer 72 can be in the range of about $2 \times 10^{20}$ cm$^{-3}$ to about $3 \times 10^{20}$ cm$^{-3}$. For example, when the solid solubility of gallium in the base semiconductor material of the epitaxial source/drain region 70 is about $3 \times 10^{20}$ cm$^{-3}$, the gallium concentration in the main layer 72 can be about $2 \times 10^{20}$ cm$^{-3}$. The main layer 72 can have a large thickness, such as a thickness in the range of about 14 nm to about 16 nm. Forming the main layer 72 with a dopant concentration less than the dopant's solid solubility helps reduce the segregation of the dopant to the surfaces of the epitaxial source/drain region 70, particularly when the main layer 72 has a large thickness.

The finishing layer 74 has a consistent dopant concentration from the upper surface of the finishing layer 74 to the lower surface of the finishing layer 74. The dopant concentration in the finishing layer 74 is large. Specifically, the dopant concentration in the finishing layer 74 is greater than the dopant's solid solubility in the base semiconductor material of the epitaxial source/drain region 70. When the epitaxial source/drain region 70 is gallium doped silicon germanium, the gallium concentration in the finishing layer 74 can be in the range of about $5 \times 10^{20}$ cm$^{-3}$ to about $6 \times 10^{20}$ cm$^{-3}$. For example, when the solid solubility of gallium in the base semiconductor material of the epitaxial source/drain region 70 is about $3 \times 10^{20}$ cm$^{-3}$ and the gallium concentration in the main layer 72 is about $2 \times 10^{20}$ cm$^{-3}$, the gallium concentration in the finishing layer 74 can be about $6 \times 10^{20}$ cm$^{-3}$. The finishing layer 74 can have a small thickness, such as a thickness in the range of about 2 nm to about 12 nm. Specifically, the thickness of the finishing layer 74 is less than the thickness of the main layer 72. Forming the finishing layer 74 with a small thickness helps reduce the segregation of the dopant to the surfaces of the epitaxial source/drain region 70, particularly when the finishing layer 74 has a large dopant concentration. Forming the finishing layer 74 with a small thickness can also help reduce the effects of dopant segregation. For example, when the finishing layer 74 is thin, segregated dopants can still be close enough to the body of the finishing layer 74 that they contribute to doping of the finishing layer 74.

By forming the epitaxial source/drain region 70 with a main layer 72 and a finishing layer 74, the resulting epitaxial source/drain region 70 has a large dopant concentration near the surfaces of the epitaxial source/drain region 70, but the dopant is not segregated to the surfaces of the epitaxial source/drain region 70. As such, the epitaxial source/drain region 70 can have a large dopant concentration near the surfaces of the epitaxial source/drain region 70, even after the epitaxial source/drain region 70 is subject to an etching process, such as a contact opening etching process (discussed further below).

As an example to form the main layer 72 and finishing layer 74, an epitaxial growth process may be performed, where the intermediate structure is exposed to several precursors. The precursors include a plurality of semiconductor material precursors and one or more dopant precursor(s). The semiconductor material precursors are precursors for depositing the base semiconductor material, e.g., silicon germanium, germanium, germanium tin, or the like. For example, in an embodiment where the base semiconductor material is silicon germanium, the semiconductor material precursors can include a silicon precursor (e.g., silane (SiH$_4$), trisilane (Si$_3$H$_8$), etc.), and a germanium precursor (e.g., germane (GeH$_4$), etc.). The dopant precursor(s) are any precursor for the desired dopant(s), such as gallium, boron, or a combination thereof. In embodiments where the epitaxial source/drain region 70 is doped with gallium, the dopant precursor(s) can include trimethylgallium (Ga(CH$_3$)$_3$), triethylgallium (Ga(C$_2$H$_5$)$_3$), a gallium chloride (e.g., GaCl, GaCl$_3$, etc), or the like. The gallium precursor can include carbon or be carbon-free. In embodiments where the epitaxial source/drain region 70 is also doped with boron, the dopant precursor(s) can further include diborane (B$_2$H$_6$) or the like. During the epitaxial growth process, the intermediate structure is simultaneously exposed to the semiconductor material precursors and the dopant precursor(s). The precursor flow-rate ratios can be adjusted when growing the main layer 72 and finishing layer 74. Specifically, the dopant precursor(s) can be flowed at a low rate when growing the main layer 72, and can be flowed at a high rate when growing the finishing layer 74. For example, when growing the main layer 72, the silicon precursor can be flowed at a rate in the range of about 20 sccm and about 100 sccm, the germanium precursor can be flowed at a rate in the range of about 50 sccm and about 500 sccm, and the gallium precursor can be flowed at a rate in the range of about 20 sccm and about 100 sccm. Likewise, when growing the finishing layer 74, the silicon precursor can be flowed at a rate in the range of about 20 sccm and about 100 sccm, the germanium precursor can be flowed at a rate in the range of about 50 sccm and about 500 sccm, and the gallium precursor can be flowed at a rate in the range of about 20 sccm and about 100 sccm. The main layer 72 and finishing layer 74 can be formed in the same processing chamber, e.g., in situ without breaking a vacuum, and the flow rates of the various precursors can be adjusted during growth to form the desired regions.

Figure 5B:
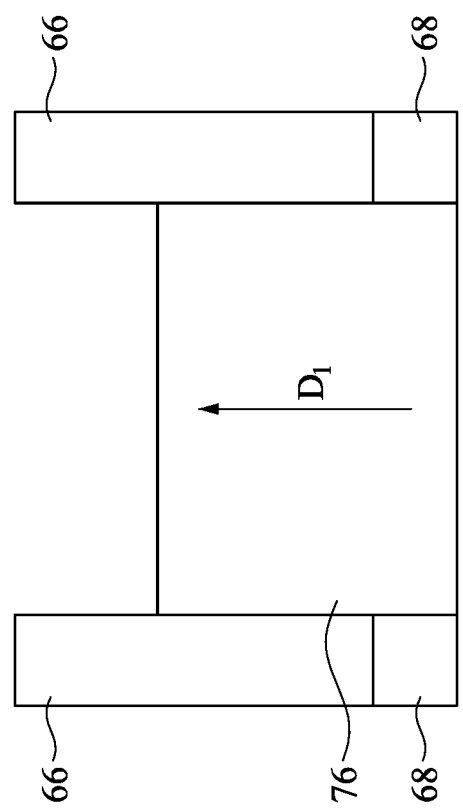

FIG. 5B illustrates an epitaxial source/drain region 70 that includes a single layer 76. The layer 76 is formed of a base semiconductor material, e.g., silicon germanium, germanium, germanium tin, etc. The layer 76 also has a graded impurity concentration. Specifically, the dopant concentration of the layer 76 increases continuously along a direction D$_1$, e.g., in a direction extending from the lower surface of the layer 76 to the upper surface of the layer 76. At the lower surface of the layer 76, the dopant concentration is less than the dopant's solid solubility (discussed above) in the base semiconductor material. At the upper surface of the layer 76, the dopant concentration is greater than the dopant's solid solubility in the base semiconductor material. Continuing the example when the epitaxial source/drain region 70 is gallium doped silicon germanium, the dopant concentration at the lower surface of the layer 76 can be in the range of about 3×10$^{20}$ cm$^{-3}$ to about 5×10$^{20}$ cm$^{-3}$, and the dopant concentration at the upper surface of the layer 76 can be in the range of about 5×10$^{20}$ cm$^{-3}$ to about 6×10$^{20}$ cm$^{-3}$.

As an example to form the layer 76, an epitaxial growth process may be performed, where the intermediate structure is exposed to several precursors. The precursors include a plurality of semiconductor material precursors and one or more dopant precursor(s). The semiconductor material precursors are precursors for depositing the base semiconductor material, e.g., silicon germanium, germanium, germanium tin, or the like, and can be similar to the semiconductor material precursors discussed above. The dopant precursor(s) are any precursor for the desired dopant(s), and can be similar to the dopant precursor(s) discussed above. During the epitaxial growth process, the intermediate structure is simultaneously exposed to the semiconductor material precursors and the dopant precursor(s). The precursor flow-rate ratios can be adjusted when growing the layer 76. Specifically, the dopant precursor(s) can be flowed at a low rate when forming the lower portion of the layer 76, and can be flowed at a high rate when forming the upper portion of the layer 76. For example, the gallium precursor can be flowed at a rate in the range of about 20 sccm and about 100 sccm at the beginning of growth, and can be continually increased to being flowed at a greater rate in the range of about 20 sccm and about 100 sccm at the end of growth. The flow rates of the various precursors can be adjusted continually during growth to form the layer 76 at desired doping concentrations.

FIG. 5C illustrates an epitaxial source/drain region 70 that includes a main layer 78M, finishing layers 78F, and impurity layers 80. The main layer 78M and finishing layers 78F are each formed of a base semiconductor material, e.g., silicon germanium, germanium, germanium tin, etc., and are doped to the same impurity concentration. The impurity layers 80 can be a substantially pure layer of the impurity that the main layer 78M and finishing layers 78F are each doped with. Continuing the example above, the main layer 78M and finishing layers 78F can each be gallium doped silicon germanium, and the impurity layers 80 can be a substantially pure layer of gallium.

The main layer 78M and finishing layers 78F are formed to a same low dopant concentration. Specifically, the dopant concentration in the main layer 78M and finishing layers 78F is less than the dopant's solid solubility (discussed above) in the base semiconductor material of the epitaxial source/drain region 70. For example, when the epitaxial source/drain region 70 is gallium doped silicon germanium, the gallium concentration in the main layer 78M and finishing layers 78F can be in the range of about 2×10$^{20}$ cm$^{-3}$ to about 3×10$^{20}$ cm$^{-3}$. The main layer 78M can have a large thickness, such as a thickness in the range of about 14 nm to about 16 nm. The finishing layers 78F can have a small thickness, such as a thickness in the range of about 1 nm to about 2 nm.

The impurity layers 80 are a substantially pure layer of the dopant, e.g., gallium. The epitaxial source/drain region 70 includes alternating ones of the impurity layers 80 and finishing layers 78F. For example, the epitaxial source/drain region 70 can include three finishing layers 78F and three impurity layers 80. The impurity layers 80 can be very thin. In some embodiments, the impurity layers 80 are one monolayer thick.

As an example to form the various layers, a plurality of epitaxial growth processes may be performed to form the main layer 78M and finishing layers 78F, where the intermediate structure is exposed to several precursors. Between each epitaxial growth process, a deposition process is performed to form the impurity layers 80. The main layer 78M and finishing layers 78F can be formed by an epitaxial growth process using similar precursors as those discussed above with respect to FIG. 5A. Each of the impurity layers 80 can be formed by a delta doping process on the exposed surface of a respective underlying layer (e.g., main layer 78M or finishing layers 78F). Delta doping may be accomplished by flowing a dopant precursor without flowing semiconductor material precursors, e.g., after stopping the flow of the semiconductor material precursors. In some embodiments, the dopant precursor is, e.g., gallium chloride (GaCl$_3$). Gallium chloride can form a self-limited gallium monolayer on the exposed surface of the respective underlying layer. The gallium monolayer is terminated with chlorine. The delta doping can be performed to a desired surface concentration. In some embodiments, the delta doping is performed to a surface concentration on the order of about 10$^{13}$ cm$^{-2}$. A reducing agent, such as silane (SiH$_4$) or germane (GeH$_4$) can then be flowed to remove the chlorine, and an epitaxial growth process similar to that discussed above is then performed to form the next finishing layer 78F. In some embodiments, the reducing step and the subsequent epitaxial growth can be combined, e.g., the reducing agent can be flowed as part of the epitaxial growth process for forming the next finishing layer 78F.

Figure 5D:
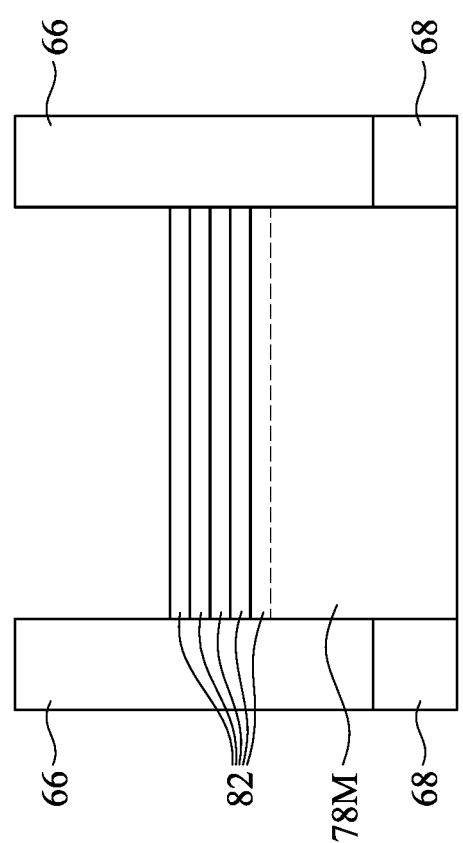

After the various layers discussed above are formed, an anneal can optionally be performed. The resulting post-anneal structure is shown in FIG. 5D. The anneal diffuses some or all of the impurity layers 80 into surrounding finishing layers 78F and the top portion of the main layer 78M, thus forming doped finishing layers 82. Each of the doped finishing layers 82 can have a same dopant concentration, which can be greater than the dopant's solid solubility in the base semiconductor material of the epitaxial source/drain region 70. As such, the upper portion of the epitaxial source/drain region 70 has a large dopant concentration near the surface of the epitaxial source/drain region 70, without the dopant being segregated to the surfaces of the epitaxial source/drain region 70. After the anneal, each of the doped finishing layers 82 can have a same crystalline structure.

Figure 5E:
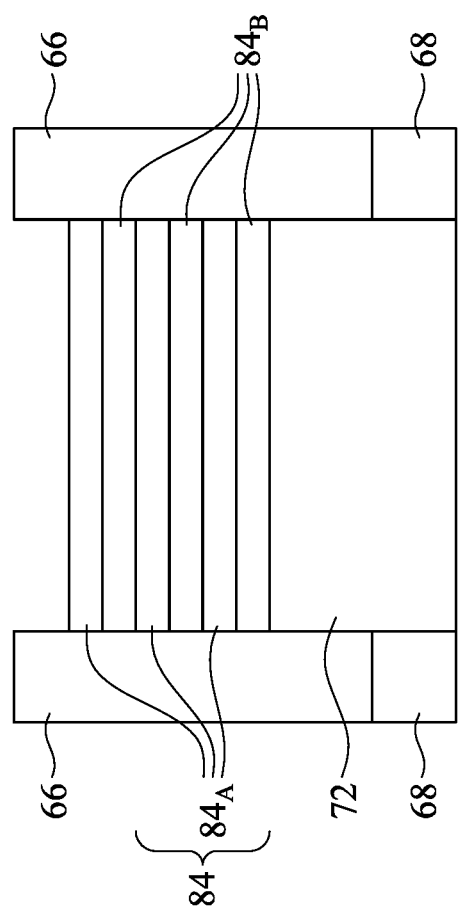

FIG. 5E illustrates an epitaxial source/drain region 70 that is similar to the embodiment of FIG. 5A, except the finishing layer 74 is replaced by an equivalent superlattice structure 84. The superlattice structure 84 can be similar in electrical function to the finishing layer 74, having an equivalent band structure as the finishing layer 74. However, instead of being a single continuous layer, the superlattice structure 84 is formed of a plurality of alternating superlattice layers $84_A$ and $84_B$. The main layer 72 and superlattice layers $84_A$ and $84_B$ are formed by epitaxial growth processes using similar precursors as those discussed above with respect to FIG. 5A, but the main layer 72 and superlattice layers $84_A$ and $84_B$ can be formed of different base semiconductor materials that are doped with the same impurity. The main layer 72 and superlattice layers $84_A$ and $84_B$ are doped to different impurity concentrations. Specifically, the dopant concentration of each of the superlattice layers $84_A$ and $84_B$ is greater than that of the main layer 72.

The superlattice layers $84_A$ and $84_B$ comprise semiconductor materials with different band gaps. Continuing the example when the epitaxial source/drain region 70 is gallium doped silicon germanium, the superlattice layers $84_A$ can be gallium doped silicon, and the superlattice layers $84_B$ can be gallium doped germanium. The dopant concentration in each of the superlattice layers $84_A$ and $84_B$ is large. Specifically, the dopant concentration in each of the superlattice layers $84_A$ and $84_B$ is greater than the dopant's solid solubility (discussed above) in the base semiconductor material of the main layer 72. As such, when the epitaxial source/drain region 70 is gallium doped silicon germanium, the gallium concentration in the superlattice layers $84_A$ and $84_B$ can be in the range of about $5\times10^{20}$ cm$^{-3}$ to about $6\times10^{20}$ cm$^{-3}$. The superlattice layers $84_A$ and $84_B$ can have a small thickness, such as a thickness in the range of about 1 nm to about 2 nm.

Forming the superlattice layers $84_A$ and $84_B$ of alternating base semiconductor materials can help reduce the segregation of the dopant to the surfaces of the epitaxial source/drain region 70. In some embodiments, the superlattice layers $84_A$ are formed of a semiconductor material that has a high bonding energy to the dopant, and the superlattice layers $84_B$ are formed of a semiconductor material that has a low bonding energy to the dopant. For example, the bonding energy of gallium to silicon (about 4.56 eV) is greater than the bonding energy of gallium to germanium (about 2.56 eV). When the superlattice layers $84_A$ are gallium doped silicon and the superlattice layers $84_B$ are gallium doped germanium, the superlattice layers $84_A$ act as segregation stop layers, such that gallium attempting to segregate to the surface of the epitaxial source/drain region 70 is impeded. As a result, the superlattice layers $84_A$ can be doped to a higher concentration than the superlattice layers $84_B$, and gallium segregation from the superlattice layers $84_A$ can be avoided.

FIG. 5F illustrates an epitaxial source/drain region 70 that is similar to the embodiment of FIG. 5A, except the finishing layer 74 is replaced by a plurality of alternating finishing layers $86_A$ and $86_B$. The main layers 72 and finishing layers $86_A$ and $86_B$ are formed of the same base semiconductor material, e.g., silicon germanium, germanium, germanium tin, etc. However, the main layer 72 and finishing layers $86_A$ and $86_B$ are doped to different impurity concentrations. Specifically, the dopant concentration of the finishing layers $86_A$ and $86_B$ is greater than that of the main layer 72.

The finishing layers $86_A$ and $86_B$ comprise the same semiconductor material and are doped to the same impurity concentration. Continuing the example when the epitaxial source/drain region 70 is gallium doped silicon germanium, the finishing layers $86_A$ and $86_B$ can each be gallium doped silicon germanium. The dopant concentration in each of the finishing layers $86_A$ and $86_B$ is large. Specifically, the dopant concentration in each of the finishing layers $86_A$ and $86_B$ is greater than the dopant's solid solubility (discussed above) in the base semiconductor material of the epitaxial source/drain region 70. As such, when the epitaxial source/drain region 70 is gallium doped silicon germanium, the gallium concentration in the finishing layers $86_A$ and $86_B$ can be in the range of about $5\times10^{20}$ cm$^{-3}$ to about $6\times10^{20}$ cm$^{-3}$. The finishing layers $86_A$ and $86_B$ can have a small thickness, such as a thickness in the range of about 1 nm to about 2 nm.

The main layers 72 and finishing layers $86_A$ and $86_B$ can be formed by epitaxial growth processes using similar precursors as those discussed above with respect to FIG. 5A. However, the epitaxial growth rates can be different for the finishing layers $86_A$ and $86_B$. The epitaxial growth rate of the finishing layers $86_A$ and $86_B$ affects the amount of dopant segregation during growth and also affects the quality of the grown epitaxy. In some embodiments, the finishing layers $86_A$ are grown at a high epitaxial growth rate, and the finishing layers $86_B$ are grown at a low epitaxial growth rate. Growing the finishing layers $86_A$ at a high epitaxial growth rate helps reduce the segregation of the dopant to the surfaces of the epitaxial source/drain region 70. Growing the finishing layers $86_B$ at a low epitaxial growth rate helps reduce the quantity of crystalline defects in the epitaxial source/drain region 70. As such, the finishing layers $86_B$ can have less crystalline defects than the finishing layers $86_A$, and the finishing layers $86_A$ and $86_B$ can have different crystalline structures.

The epitaxial growth rate of the finishing layers $86_A$ and $86_B$ can be controlled by controlling the environmental conditions during the epitaxial growth processes. Specifically, the temperature during the epitaxial growth processes affects the epitaxial growth rate, with lower temperatures producing higher growth rates. As such, in some embodiments, the finishing layers $86_A$ are grown at a low temperature, and the finishing layers $86_B$ are grown at a high temperature. For example, the finishing layers $86_A$ can be grown at a temperature in the range of about 300° C. to about 420° C., and the finishing layers $86_B$ can be grown at a temperature in the range of about 500° C. to about 800° C. Growing the finishing layers $86_A$ at a lower temperature than the finishing layers $86_B$ results in the finishing layers $86_A$ having a higher activation energy than the finishing layers $86_B$, which creates a high potential barrier and thus reduces dopant segregation in the finishing layers $86_A$. When the finishing layers $86_A$ have a high activation energy, the finishing layers $86_A$ act as segregation stop layers, such that gallium attempting to segregate to the surface of the epitaxial source/drain region 70 is impeded.

The epitaxial source/drain regions 70 described with respect to FIGS. 5A through 5F are described as having gallium impurities. In some embodiments, the epitaxial source/drain regions 70 are co-doped with multiple impurities. Specifically, the epitaxial source/drain regions 70 can be doped with boron in addition to gallium. For example, the main layer 72 and finishing layer 74 (see FIG. 5A), layer 76 (see FIG. 5B), main layer 78M and finishing layers 78F (see FIG. 5C), main layer 72 and superlattice layers $84_A$ and $84_B$ (see FIG. 5E), and/or main layer 72 and finishing layers $86_A$ and $86_B$ (see FIG. 5F) can be further doped with boron. The layers can be doped with boron to a concentration in the range of about $2\times10^{20}$ cm$^{-3}$ to about $1\times10^{21}$ cm$^{-3}$. Co-doping the epitaxial source/drain regions 70 can help ensure sufficient doping throughout the epitaxial source/drain regions 70 even if some gallium segregation occurs. In some embodiments, the concentration of gallium is less than the concentration of boron in the main layer 72 (see FIGS. 5A, 5E, 5F) and/or main layer 78M (see FIGS. 5C and 5D), and the concentration of gallium is greater than the concentration of boron in the finishing layer 74 (see FIG. 5A), finishing layers 82 (see FIG. 5D), superlattice layers $84_A$ and $84_B$ (see FIG. 5E), and finishing layers $86_A$ and $86_B$ (see FIG. 5F).

Figure 6B:
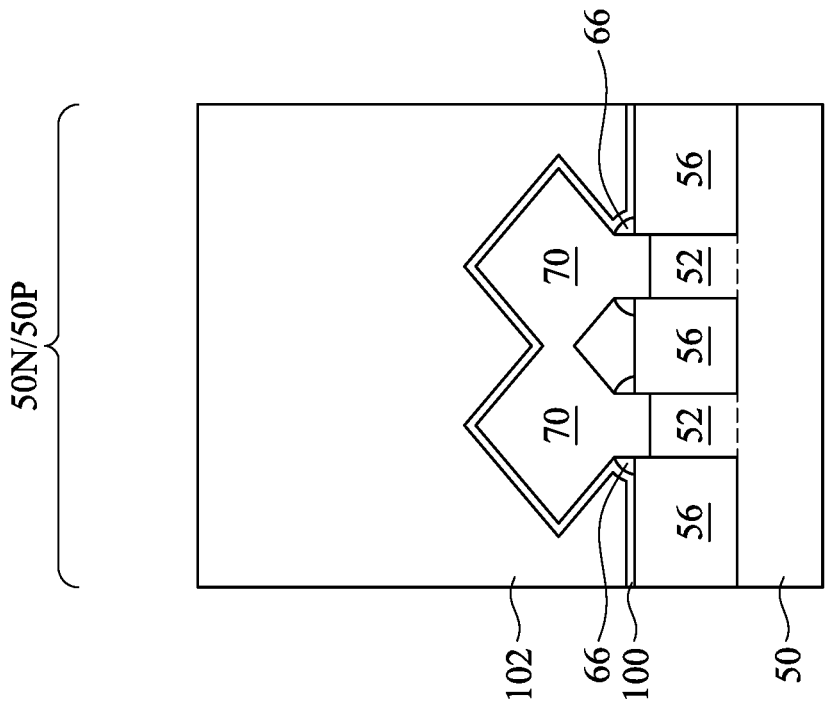
FIGS. 6A through 12B are cross-sectional views of further intermediate stages in the manufacturing of FinFETs, in accordance with some embodiments.
Figure 6A:
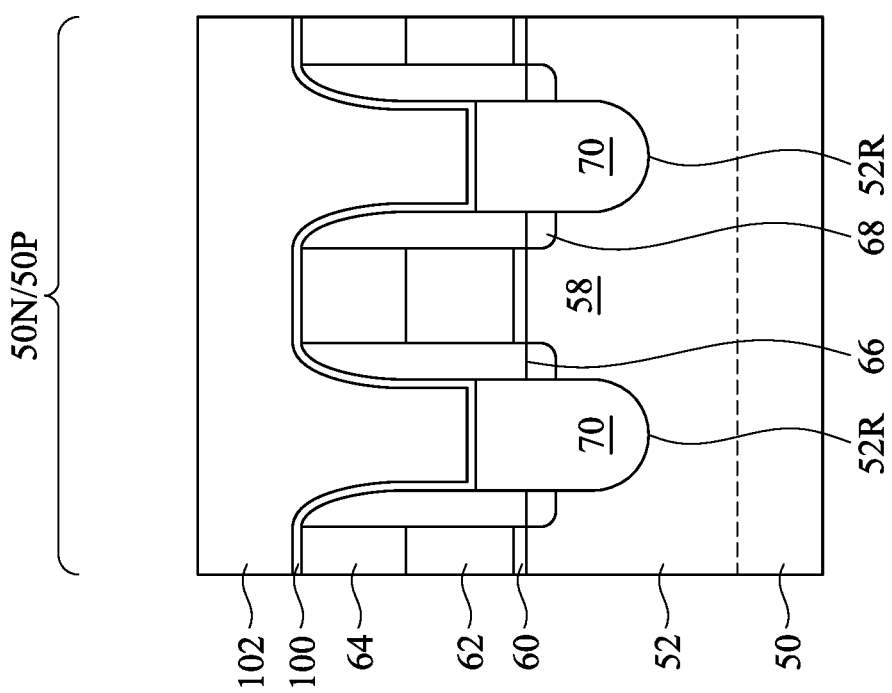

In FIGS. 6A and 6B, a first ILD layer 102 is deposited over the intermediate structure. The first ILD layer 102 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 100 is disposed between the first ILD layer 102 and the epitaxial source/drain regions 70, the masks 64, and the gate spacers 66. The CESL 100 may comprise a dielectric material, such as, silicon nitride, silicon oxide, silicon oxynitride, or the like, having a different etch rate than the material of the first ILD layer 102.

Figure 7B:
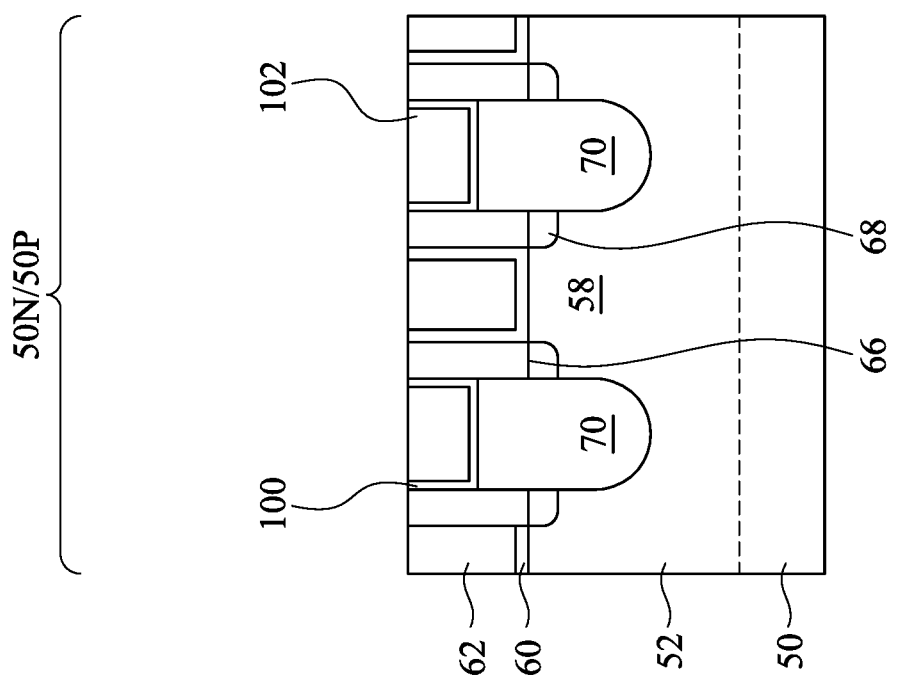
Figure 7A:
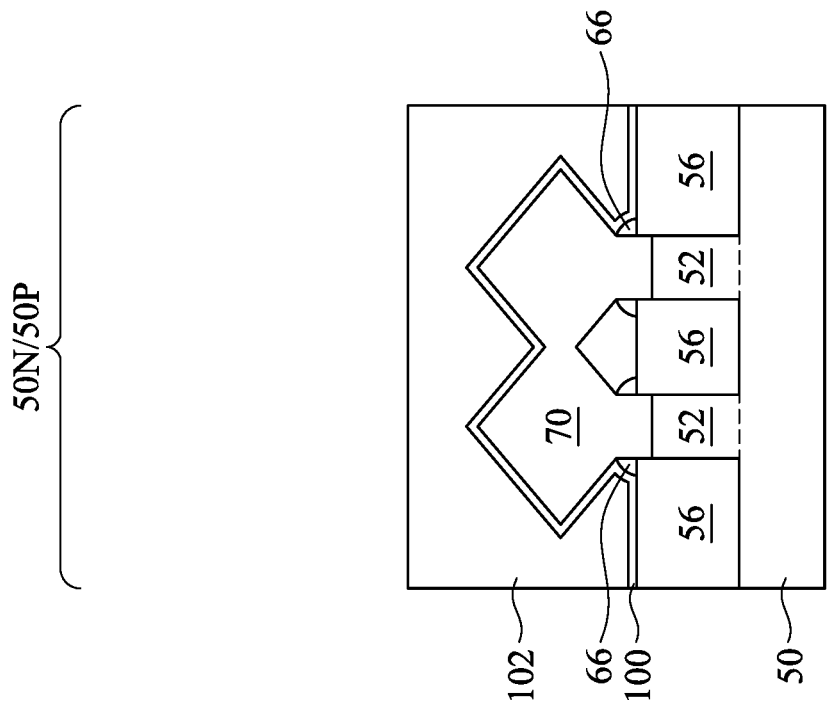

In FIGS. 7A and 7B, a planarization process, such as a CMP, may be performed to level the top surface of the first ILD layer 102 with the top surfaces of the dummy gates 62 or the masks 64. The planarization process may also remove the masks 64 on the dummy gates 62, and portions of the gate spacers 66 along sidewalls of the masks 64. After the planarization process, top surfaces of the dummy gates 62, the gate spacers 66, and the first ILD layer 102 are level. Accordingly, the top surfaces of the dummy gates 62 are exposed through the first ILD layer 102. In some embodiments, the masks 64 may remain, in which case the planarization process levels the top surface of the first ILD layer 102 with the top surfaces of the masks 64.

Figure 8B:
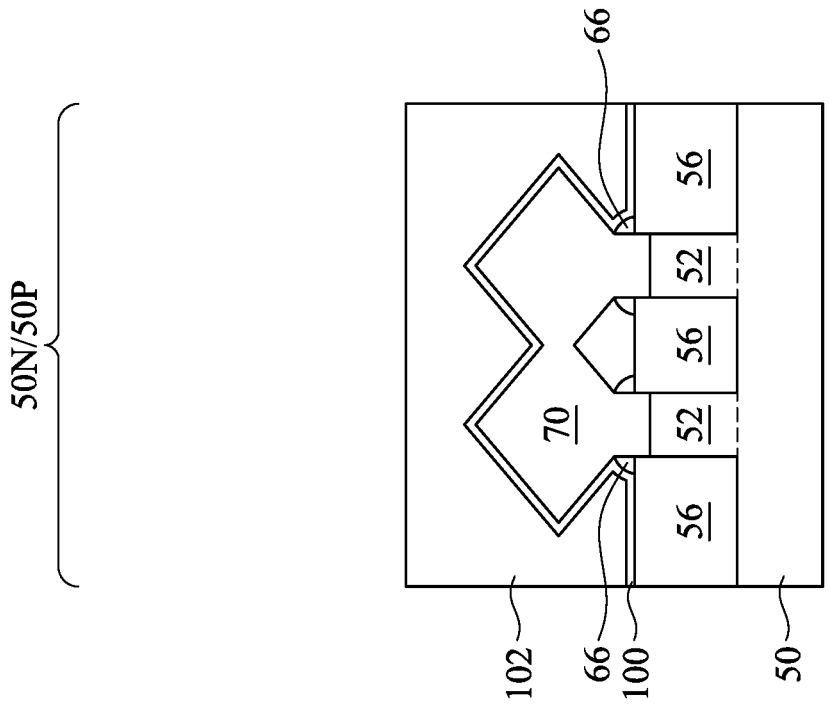
Figure 8A:
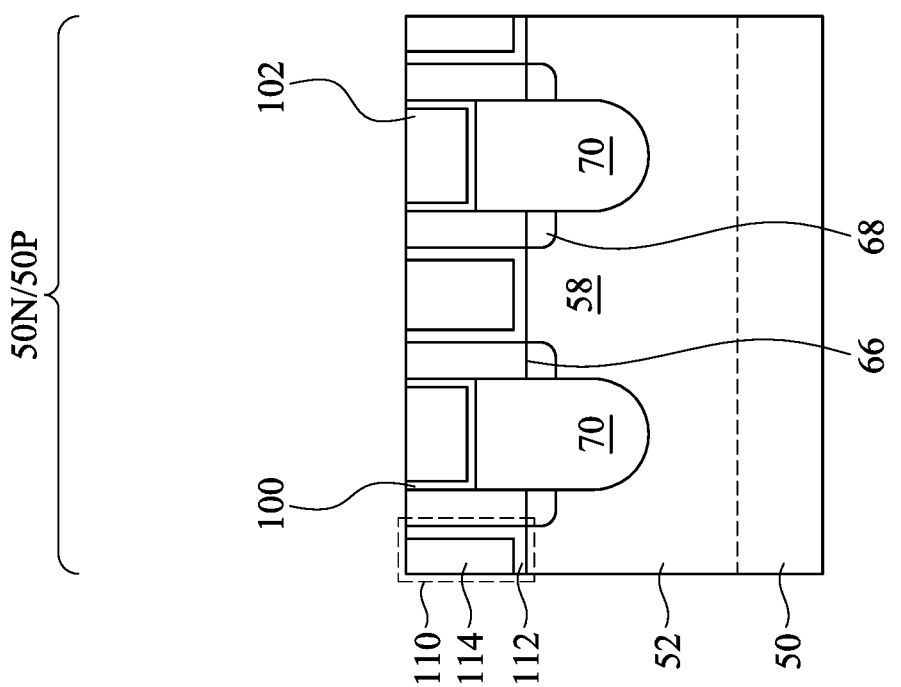

In FIGS. 8A and 8B, the dummy gates 62 are removed and are replaced with metal gates 110. The metal gates 110 include gate dielectrics 112 and gate electrodes 114. As an example to form the metal gates 110, the dummy gates 62, and the masks 64 if present, are removed in one or more etching step(s), so that recesses are formed. Portions of the dummy gate dielectrics 60 in the recesses may also be removed. In some embodiments, only the dummy gates 62 are removed and the dummy gate dielectrics 60 remain and are exposed by the recesses. In some embodiments, the dummy gate dielectrics 60 are removed from recesses in a first region of a die (e.g., a core logic region) and remain in recesses in a second region of the die (e.g., an input/output region). In some embodiments, the dummy gates 62 are removed by an anisotropic dry etch process. For example, the etching process may include a dry etch process using reaction gas(es) that selectively etch the dummy gates 62 without etching the first ILD layer 102 or the gate spacers 66. The recesses expose the fins 52. Specifically, the channel regions 58 are exposed by the recesses. Each channel region 58 is disposed between neighboring pairs of the epitaxial source/drain regions 70. During the removal, the dummy gate dielectrics 60 may be used as etch stop layers when the dummy gates 62 are etched. The dummy gate dielectrics 60 may then be optionally removed after the removal of the dummy gates 62. After the removal, the gate dielectrics 112 are deposited conformally in the recesses, such as on the top surfaces and the sidewalls of the fins 52 and on sidewalls of the gate spacers 66. The gate dielectrics 112 may also be formed on top surface of the first ILD layer 102. In accordance with some embodiments, the gate dielectrics 112 comprise silicon oxide, silicon nitride, or multilayers thereof. In some embodiments, the gate dielectrics 112 include a high-k dielectric material, and in these embodiments, the gate dielectrics 112 may have a k value greater than about 7.0, and may include a metal oxide or a silicate of Hf, Al, Zr, La, Mg, Ba, Ti, Pb, and combinations thereof. The formation methods of the gate dielectrics 112 may include Molecular-Beam Deposition (MBD), atomic layer deposition (ALD), PECVD, and the like. In embodiments where portions of the dummy gate dielectrics 60 remain in the recesses, the gate dielectrics 112 include a material of the dummy gate dielectrics 60 (e.g., $SiO_2$). The gate electrodes 114 are deposited over the gate dielectrics 112, respectively, and fill the remaining portions of the recesses. The gate electrodes 114 may include a metal-containing material such as TiN, TiO, TaN, TaC, Co, Ru, Al, W, combinations thereof, or multi-layers thereof. For example, although a single-layered gate electrode 114 is illustrated, each gate electrode 114 may comprise any number of liner layers, any number of work function tuning layers, and a fill material. After the filling of the gate electrodes 114, a planarization process, such as a CMP, may be performed to remove the excess portions of the gate dielectrics 112 and the material of the gate electrodes 114, which excess portions are over the top surface of the first ILD layer 102. The remaining portions of material of the gate electrodes 114 and the gate dielectrics 112 thus form replacement gates of the resulting FinFETs. The metal gates 110 may be also referred to as "gate stacks" or "replacement gate stacks." The metal gates 110 may extend along sidewalls of the channel regions 58 of the fins 52.

The formation of the gate dielectrics 112 in the region 50N and the region 50P may occur simultaneously such that the gate dielectrics 112 in each region are formed from the same materials, and the formation of the gate electrodes 114 may occur simultaneously such that the gate electrodes 114 in each region are formed from the same materials. In some embodiments, the gate dielectrics 112 in each region may be formed by distinct processes, such that the gate dielectrics 112 may be different materials, and/or the gate electrodes 114 in each region may be formed by distinct processes, such that the gate electrodes 114 may be different materials. Various masking steps may be used to mask and expose appropriate regions when using distinct processes.

Figure 9A:
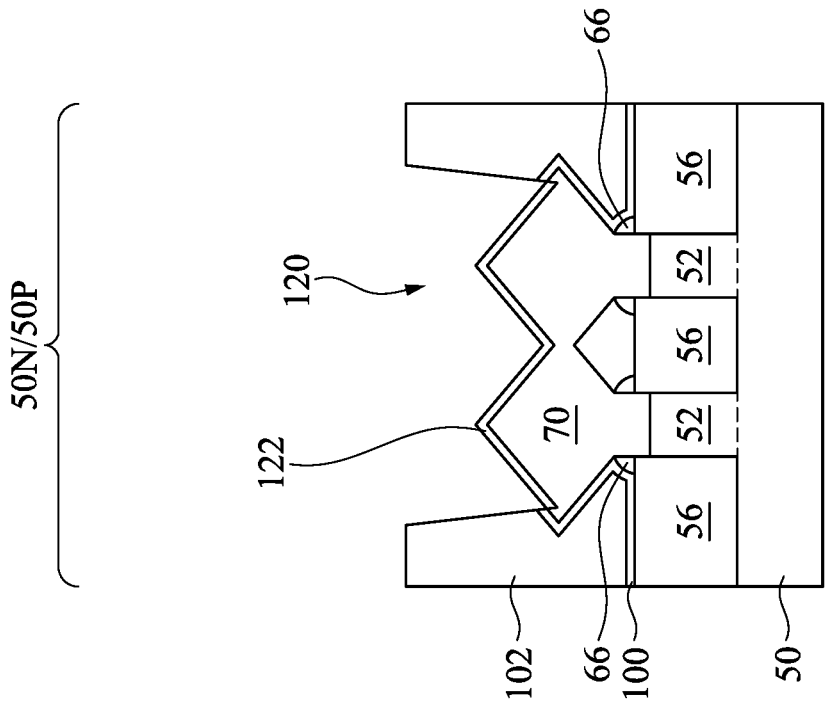
Figure 9B:
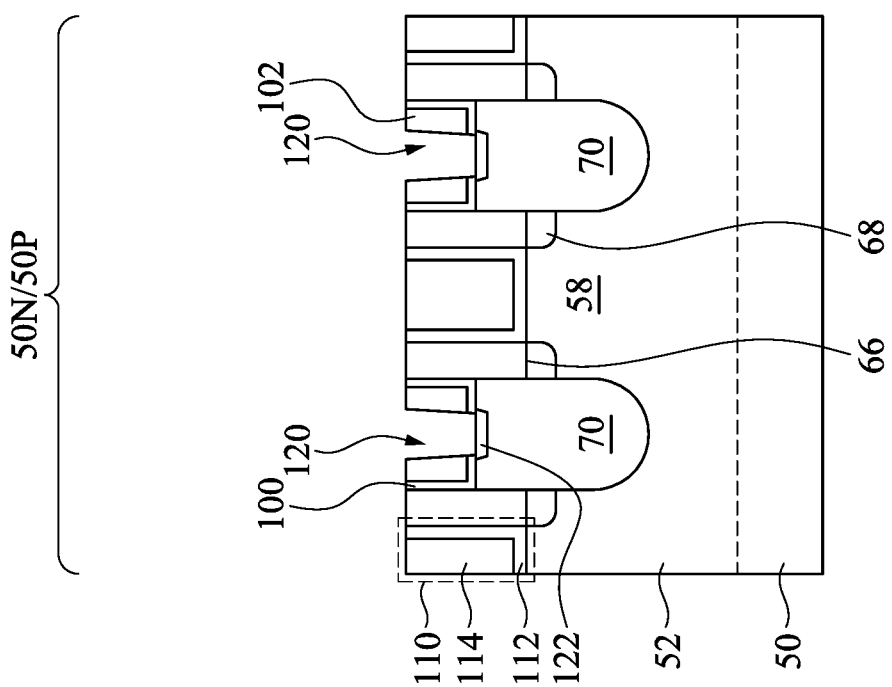

In FIGS. 9A and 9B, contact openings 120 are formed through the first ILD layer 102 and CESL 100, exposing the epitaxial source/drain regions 70. The contact openings 120 may be formed using acceptable photolithography and etching techniques. In some embodiments, some loss of the epitaxial source/drain regions 70 may be realized as a result of etching the contact openings 120, such as by over-etching. However, while the epitaxial source/drain regions 70 according to various embodiments have a large dopant concentration near the surfaces of the epitaxial source/drain regions 70, the dopant is not segregated to the surfaces of the epitaxial source/drain regions 70. Thus, even with some loss of the epitaxial source/drain regions 70, a high dopant concentration may still be achieved that can reduce contact resistance to the epitaxial source/drain regions 70.

Silicides 122 are then formed in the contact openings 120, on portions of the epitaxial source/drain regions 70 exposed by the contact openings 120. The silicides 122 can be formed by depositing a metal in the contact openings 120 and performing an anneal. The metal, can be, e.g., titanium or cobalt, which respectively, can form silicides 122 of $TiSi_2$ or $CoSi_2$. Because the epitaxial source/drain regions 70 have a large dopant concentration near their respective surfaces, the silicides 122 thus include the dopant(s) of the epitaxial source/drain regions 70 (e.g., gallium and, when present, boron). The silicides 122 are physically and electrically coupled to the epitaxial source/drain regions 70.

In some embodiments, a pre-silicide clean of the epitaxial source/drain regions 70 can be performed before forming the silicides 122. For example native oxides can form on the surfaces of the epitaxial source/drain regions 70 when etching the contact openings 120. The pre-silicide clean can be, e.g., a wet clean that removes fluorides and native oxides from the surfaces of the epitaxial source/drain regions 70. Gallium-rich native oxides (e.g., $Ga_2O_3$) and fluorides (e.g., $GaF_3$) are not volatile, and are difficult to remove. By avoiding segregation of the dopant to the surfaces of the epitaxial source/drain regions 70, the formation of gallium-rich native oxides on the surfaces of the epitaxial source/drain regions 70 can be avoided, and the native oxides on the epitaxial source/drain regions 70 can be more easily removed.

Figure 10A:
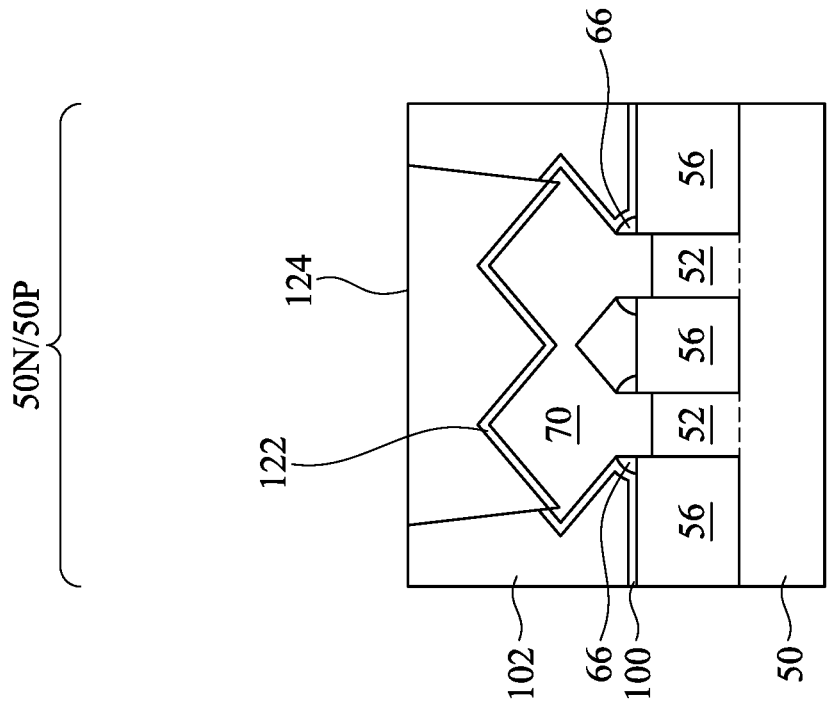
Figure 10B:
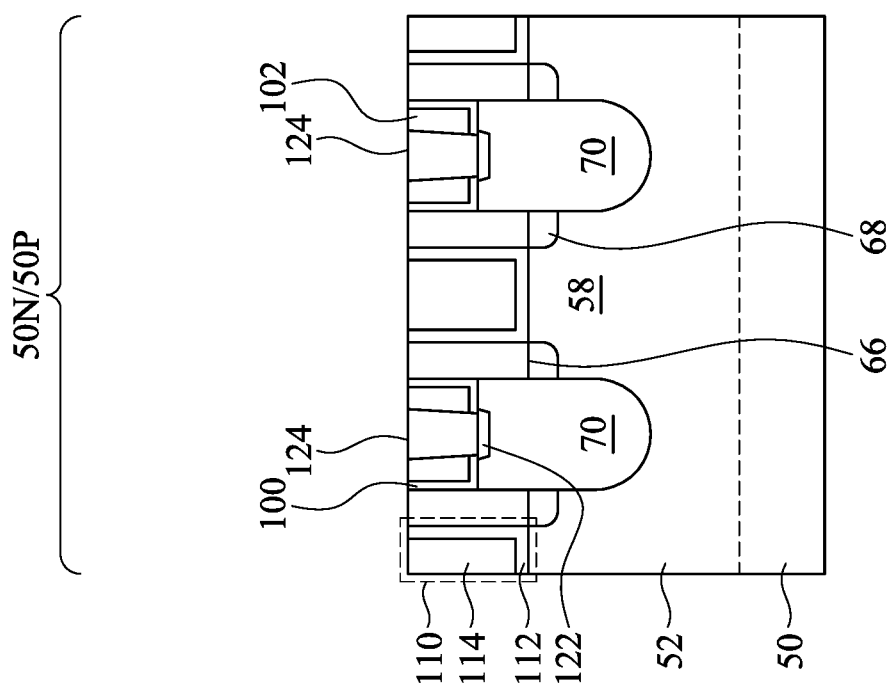

In FIGS. 10A and 10B, lower source/drain contacts 124 are formed in the contact openings 120. A liner, such as a diffusion barrier layer, an adhesion layer, or the like, and a conductive material are formed in the contact openings 120, on the silicides 122. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the first ILD layer 102. The remaining liner and conductive material form the lower source/drain contacts 124 in the contact openings 120. The lower source/drain contacts 124 are physically and electrically coupled to the epitaxial source/drain regions 70.

Figure 11A:
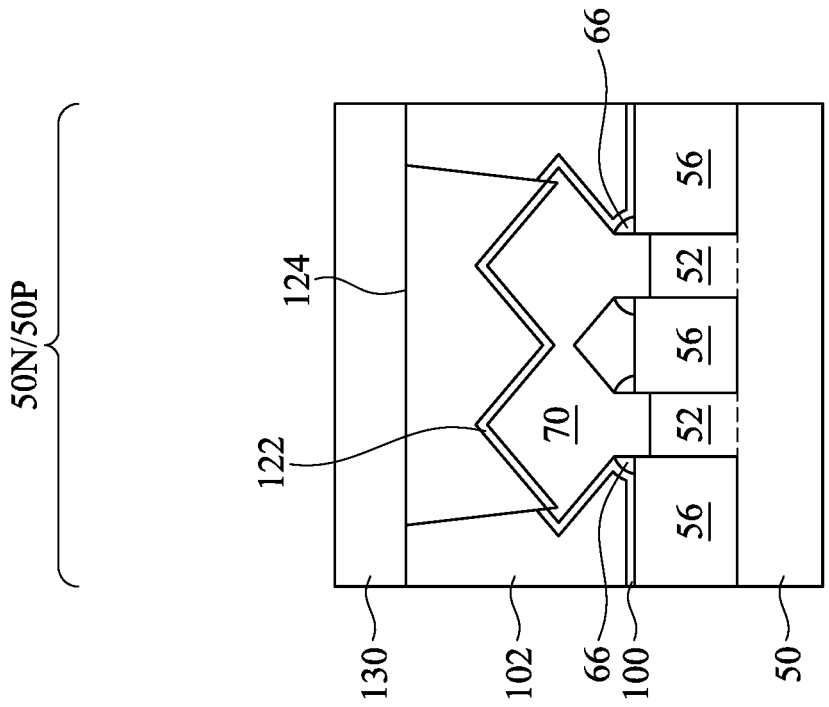
Figure 11B:
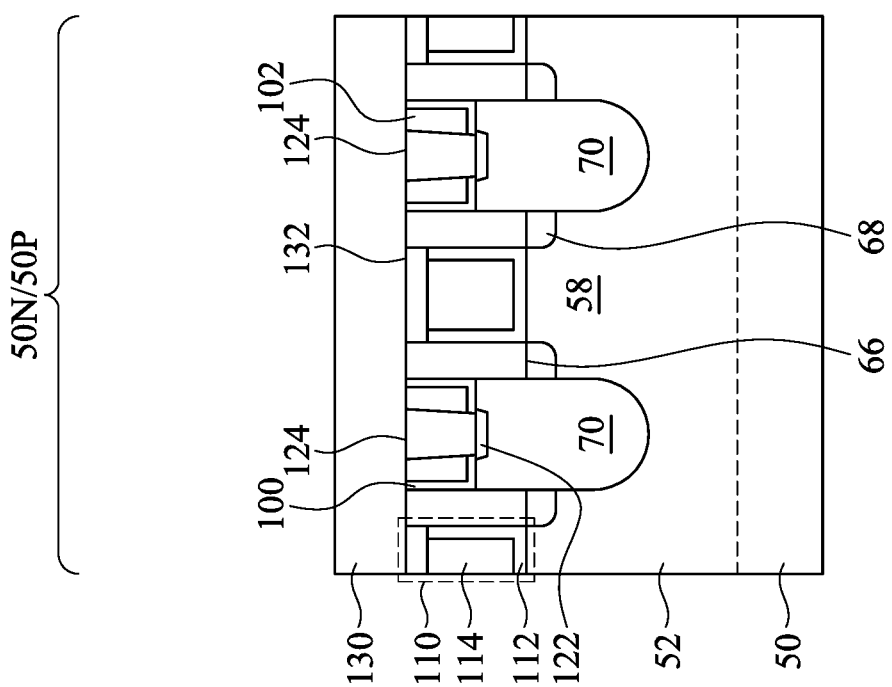

In FIGS. 11A and 11B, a second ILD layer 130 is deposited over the first ILD layer 102 and lower source/drain contacts 124. In some embodiment, the second ILD layer 130 is a flowable film formed by a flowable CVD method. In some embodiments, the second ILD layer 130 is formed of a dielectric material such as PSG, BSG, BPSG, USG, or the like, and may be deposited by any suitable method, such as CVD and PECVD. In accordance with some embodiments, before the formation of the second ILD layer 130, the metal gates 110 can be recessed, so that recesses are formed directly over the metal gates 110 and between opposing portions of the gate spacers 66. Gate masks 132 comprising one or more layers of dielectric material, such as silicon nitride, silicon oxynitride, or the like, are filled in the recesses, followed by a planarization process to remove excess portions of the dielectric material extending over the first ILD layer 102.

Figure 12A:
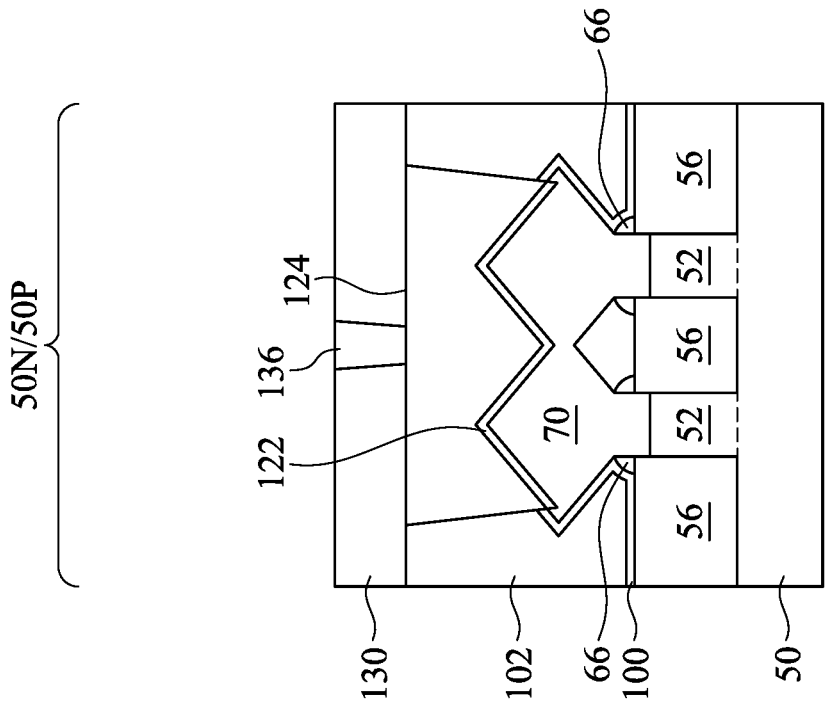
Figure 12B:
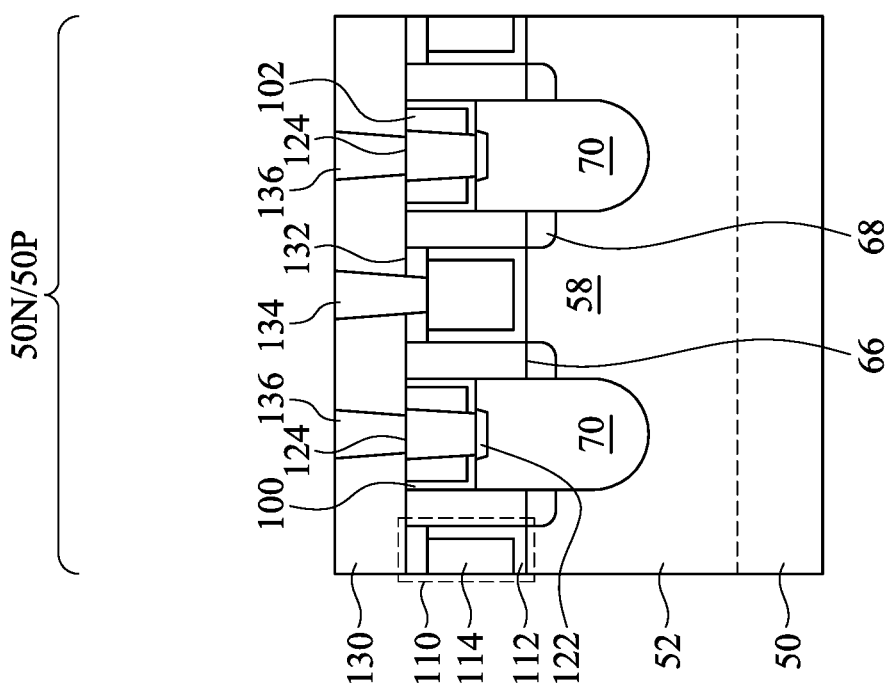

In FIGS. 12A and 12B, gate contacts 134 and upper source/drain contacts 136 are formed through the second ILD layer 130. Openings for the gate contacts 134 and upper source/drain contacts 136 are formed through the second ILD layer 130. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 130. The remaining liner and conductive material form the gate contacts 134 and upper source/drain contacts 136 in the openings. The upper source/drain contacts 136 are physically and electrically coupled to the lower source/drain contacts 124, and the gate contacts 134 are physically and electrically coupled to the metal gates 110. The gate contacts 134 can penetrate through the gate mask 132, if present. The gate contacts 134 and upper source/drain contacts 136 may be formed in different processes, or may be formed in the same process. Each of the gate contacts 134 and upper source/drain contacts 136 may be formed in different cross-sections, which may avoid shorting of the contacts.

Embodiments may achieve advantages. Doping the epitaxial source/drain regions 70 with an impurity such as gallium can increase the quantity of holes in the source/drain regions, which can be particularly advantageous for some types of source/drain regions, such as p-type source/drain regions. Forming the epitaxial source/drain regions 70 using the epitaxial growth processes described herein can help the epitaxial source/drain regions 70 have a large dopant concentration near the surfaces of the epitaxial source/drain regions 70, without the dopant being completely segregated to the surfaces of the epitaxial source/drain region 70. Removal of the gallium during the etching process for forming the contact openings 120 can thus be avoided, and the contact resistance to the epitaxial source/drain regions 70 can be reduced by forming the silicides 122 in gallium-rich regions. Further, doping the epitaxial source/drain regions 70 during growth instead of by implantation can avoid stress relaxation in the channel regions 58 that occurs during dopant implantation. Performance of the resulting FinFETs may thus be improved.

In an embodiment, a structure includes: a semiconductor substrate having a channel region; a gate stack over the channel region; and an epitaxial source/drain region adjacent the gate stack, the epitaxial source/drain region including: a main portion in the semiconductor substrate, the main portion including a semiconductor material doped with gallium, a first concentration of gallium in the main portion being less than the solid solubility of gallium in the semiconductor material; and a finishing portion over the main portion, the finishing portion doped with gallium, a second concentration of gallium in the finishing portion being greater than the solid solubility of gallium in the semiconductor material.

In some embodiments of the structure, the main portion has a first thickness, the finishing portion has a second thickness, and the second thickness is less than the first thickness. In some embodiments of the structure, the main portion includes a first layer of silicon germanium doped with gallium to the first concentration, and the finishing portion includes a second layer of silicon germanium doped with gallium to the second concentration. In some embodiments of the structure, the main portion includes a first layer of silicon germanium doped with gallium to the first concentration, and the finishing portion includes a plurality of second layers of silicon germanium doped with gallium to the second concentration. In some embodiments of the structure, each of the plurality of second layers has a same crystalline structure. In some embodiments of the structure, respective ones of the plurality of second layers alternate between having a first crystalline structure or a second crystalline structure, the first crystalline structure being different from the second crystalline structure. In some embodiments of the structure, the main portion includes a layer of silicon germanium doped with gallium, and the finishing portion includes alternating layers of silicon doped with gallium and layers of germanium doped with gallium, the layers of silicon being doped with more gallium than the layers of germanium. In some embodiments of the structure, the epitaxial source/drain region has faceted surfaces which extend laterally beyond sidewalls of the semiconductor substrate. In some embodiments, the structure further includes: an inter-layer dielectric (ILD) layer over the epitaxial source/drain region; a source/drain contact extending through the ILD layer; and a silicide disposed between the source/drain contact and the finishing portion, the silicide including gallium.

In an embodiment, a method includes: forming a gate stack on a fin; etching the fin to form a recess in the fin adjacent the gate stack; dispensing epitaxy precursors during a first growth step to form a first portion of an epitaxial source/drain region in the recess, the epitaxy precursors including semiconductor material precursors and a gallium precursor, the gallium precursor being dispensed during the first growth step at a first flow rate; and dispensing the epitaxy precursors during a second growth step to form a second portion of the epitaxial source/drain region over the first portion of the epitaxial source/drain region, the gallium precursor being dispensed during the second growth step at a second flow rate, the second flow rate being greater than the first flow rate.

In some embodiments of the method, the first portion includes a first layer of the semiconductor material doped with gallium to a first concentration, and the second portion includes a second layer of the semiconductor material doped with gallium to a second concentration, the first concentration being less than the solid solubility of gallium in the semiconductor material, the second concentration being greater than the solid solubility of gallium in the semiconductor material. In some embodiments of the method, the first portion includes a first layer of the semiconductor material doped with gallium to a first concentration, and dispensing the epitaxy precursors during the second growth step includes: dispensing the epitaxy precursors during the second growth step to form a plurality of second layers over the first layer. In some embodiments, the method further includes: growing a first subset of the plurality of second layers at a first temperature during the second growth step; and growing a second subset of the plurality of second layers at a second temperature during the second growth step, the second temperature being greater than the first temperature. In some embodiments of the method, the first layer includes silicon germanium doped with gallium to the first concentration, where a first subset of the plurality of second layers include germanium doped with gallium to a second concentration, and where a second subset of the plurality of second layers include silicon doped with gallium to a third concentration, the third concentration being greater than the second concentration, the second concentration being greater than the first concentration. In some embodiments of the method, the epitaxy precursors further include a boron precursor. In some embodiments, the method further includes: depositing an inter-layer dielectric (ILD) layer over the epitaxial source/drain region; etching an opening in the ILD layer, the opening exposing the second portion of the epitaxial source/drain region; forming a silicide in the opening and on the second portion of the epitaxial source/drain region, the silicide including gallium; and forming a source/drain contact in the opening and on the silicide.

In an embodiment, a method includes: forming a gate stack on a fin; etching the fin to form a recess in the fin adjacent the gate stack; dispensing semiconductor material precursors to form a first epitaxial layer in the recess; after dispensing the semiconductor material precursors, dispensing a dopant precursor to form an impurity layer on the first epitaxial layer; after dispensing the dopant precursor, resuming the dispensing of the semiconductor material precursors to form a second epitaxial layer on the impurity layer; and performing an anneal to diffuse at least a portion of the impurity layer into the first epitaxial layer and the second epitaxial layer.

In some embodiments of the method, the semiconductor material precursors include germane, the dopant precursor is gallium chloride, and after dispensing the dopant precursor, the impurity layer includes a gallium monolayer terminated with chlorine. In some embodiments, the method further includes: after dispensing the dopant precursor and before resuming the dispensing of the semiconductor material precursors, dispensing a reducing agent on the impurity layer, the reducing agent removing the chlorine from the gallium monolayer. In some embodiments of the method, resuming the dispensing of the semiconductor material precursors includes simultaneously dispensing a reducing agent and the semiconductor material precursors, the reducing agent removing the chlorine from the gallium monolayer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
 forming a gate stack on a fin;
 etching the fin to form a recess in the fin adjacent the gate stack;
 dispensing epitaxy precursors during a first growth step to form a first portion of an epitaxial source/drain region in the recess, the epitaxy precursors comprising semiconductor material precursors and a gallium precursor, the gallium precursor being dispensed during the first growth step at a first flow rate; and dispensing the epitaxy precursors during a second growth step to form a second portion of the epitaxial source/drain region over the first portion of the epitaxial source/drain region, the gallium precursor being dispensed during the second growth step at a second flow rate, the second flow rate being greater than the first flow rate.

2. The method of claim 1, wherein the first portion comprises a first layer of the semiconductor material doped with gallium to a first concentration, and wherein the second portion comprises a second layer of the semiconductor material doped with gallium to a second concentration, the first concentration being less than the solid solubility of gallium in the semiconductor material, the second concentration being greater than the solid solubility of gallium in the semiconductor material.

3. The method of claim 1, wherein the first portion comprises a first layer of the semiconductor material doped with gallium to a first concentration, and wherein dispensing the epitaxy precursors during the second growth step comprises:
dispensing the epitaxy precursors during the second growth step to form a plurality of second layers over the first layer.

4. The method of claim 3 further comprising:
growing a first subset of the plurality of second layers at a first temperature during the second growth step; and
growing a second subset of the plurality of second layers at a second temperature during the second growth step, the second temperature being greater than the first temperature.

5. The method of claim 3, wherein the first layer comprises silicon germanium doped with gallium to the first concentration, wherein a first subset of the plurality of second layers comprise germanium doped with gallium to a second concentration, and wherein a second subset of the plurality of second layers comprise silicon doped with gallium to a third concentration, the third concentration being greater than the second concentration, the second concentration being greater than the first concentration.

6. The method of claim 1, wherein the epitaxy precursors further comprise a boron precursor.

7. The method of claim 1 further comprising:
depositing an inter-layer dielectric (ILD) layer over the epitaxial source/drain region;
etching an opening in the ILD layer, the opening exposing the second portion of the epitaxial source/drain region;
forming a silicide in the opening and on the second portion of the epitaxial source/drain region, the silicide comprising gallium; and
forming a source/drain contact in the opening and on the silicide.

8. A method comprising:
forming a gate stack on a fin;
etching the fin to form a recess in the fin adjacent the gate stack;
dispensing semiconductor material precursors to form a first epitaxial layer in the recess;
after dispensing the semiconductor material precursors, dispensing a dopant precursor to form an impurity layer on the first epitaxial layer;
after dispensing the dopant precursor, resuming the dispensing of the semiconductor material precursors to form a second epitaxial layer on the impurity layer; and
performing an anneal to diffuse at least a portion of the impurity layer into the first epitaxial layer and the second epitaxial layer.

9. The method of claim 8, wherein the semiconductor material precursors comprise germane, wherein the dopant precursor is gallium chloride, and wherein after dispensing the dopant precursor, the impurity layer comprises a gallium monolayer terminated with chlorine.

10. The method of claim 9 further comprising:
after dispensing the dopant precursor and before resuming the dispensing of the semiconductor material precursors, dispensing a reducing agent on the impurity layer, the reducing agent removing the chlorine from the gallium monolayer.

11. The method of claim 9, wherein resuming the dispensing of the semiconductor material precursors comprises simultaneously dispensing a reducing agent and the semiconductor material precursors, the reducing agent removing the chlorine from the gallium monolayer.

12. The method of claim 9, wherein the semiconductor material precursors are precursors for silicon germanium, the dopant precursor is a precursor for gallium, and after performing the anneal, the first epitaxial layer comprises gallium at a first concentration, and the second epitaxial layer comprises gallium at a second concentration, the first concentration being less than the solid solubility of gallium in silicon germanium, the second concentration being greater than the solid solubility of gallium in silicon germanium.

13. The method of claim 9 further comprising:
depositing an inter-layer dielectric (ILD) layer on the second epitaxial layer;
etching an opening in the ILD layer, the opening exposing the second epitaxial layer;
forming a silicide in the opening and on the second epitaxial layer, the silicide comprising gallium; and
forming a source/drain contact in the opening and on the silicide.

14. A method comprising:
forming a gate stack on a channel region of a substrate;
patterning a recess in the substrate adjacent the channel region;
growing a first epitaxial layer in the recess, the first epitaxial layer comprising a semiconductor material doped with gallium to a first concentration;
growing a second epitaxial layer on the first epitaxial layer, the second epitaxial layer comprising the semiconductor material doped with gallium to a second concentration, the second concentration greater than the first concentration; and
growing a third epitaxial layer on the second epitaxial layer, the third epitaxial layer comprising the semiconductor material doped with gallium to the second concentration, the third epitaxial layer grown at a higher epitaxial growth rate than the second epitaxial layer.

15. The method of claim 14, wherein the first concentration is less than the solid solubility of gallium in the semiconductor material, and the second concentration is greater than the solid solubility of gallium in the semiconductor material.

16. The method of claim 14, wherein the semiconductor material is silicon germanium.

17. The method of claim 14, wherein the semiconductor material of the first epitaxial layer is further doped with boron to a third concentration, the third concentration greater than the first concentration.

18. The method of claim 17, wherein the semiconductor material of the second epitaxial layer and the third epitaxial layer is further doped with boron to a fourth concentration, the fourth concentration less than the second concentration.

19. The method of claim 14 further comprising:
depositing an inter-layer dielectric (ILD) layer on the third epitaxial layer;
etching an opening in the ILD layer, the opening exposing the third epitaxial layer;
forming a silicide in the opening and on the third epitaxial layer, the silicide comprising gallium; and
forming a source/drain contact in the opening and on the silicide.

20. The method of claim 14, wherein the third epitaxial layer is grown at a lower temperature than the second epitaxial layer.

* * * * *